United States Patent [19]
Saika

[11] Patent Number: 5,995,734
[45] Date of Patent: Nov. 30, 1999

[54] METHOD FOR GENERATING TRANSISTOR PLACEMENT IN AN AUTOMATIC CELL LAYOUT DESIGN

[75] Inventor: Shunji Saika, Kyoto, Japan

[73] Assignee: Matsushita Electric Industrial Co., Ltd., Osaka, Japan

[21] Appl. No.: 08/813,890

[22] Filed: Mar. 7, 1997

[30] Foreign Application Priority Data

Mar. 7, 1996 [JP] Japan .................................. 8-049921

[51] Int. Cl.$^6$ .................................................. G06F 17/50
[52] U.S. Cl. .............................. 395/500.1; 395/500.03; 395/500.08; 395/500.09; 395/500.12
[58] Field of Search ..................... 364/488, 489, 364/490, 491; 395/500.1, 500.03, 500.08, 500.09, 500.12

[56] References Cited

U.S. PATENT DOCUMENTS

| | | | |
|---|---|---|---|
| 5,633,807 | 5/1997 | Fishburn et al. | 364/491 |
| 5,666,288 | 9/1997 | Jones et al. | 364/490 |
| 5,675,501 | 10/1997 | Aoki | 364/490 |
| 5,701,255 | 12/1997 | Fukui | 364/491 |
| 5,737,236 | 4/1998 | Maziasz et al. | 364/490 |

OTHER PUBLICATIONS

Saika et al "A Two–Dimensional Transistor Placement for Cell Synthesis," IEEE, pp. 557–562, Mar. 1997.
Tani et al. "Two–Dimensional Layout Synthesis for Large–Scale CMOS Circuits," IEEE, pp. 490–493, 1991.
Srinivas Davadas "Optical Layout Via Boolean Satisfiability," IEEE, pp. 294–297, 1989.
Levebvre et al "Transistor Placement and Interconnect Algorithms for Leaf Cell Synthesis," IEEE, pp. 119–123, 1990.
Hsieh et al "LIB: A CMOS Cell Compiler," IEEE, pp. 994–1005, Aug. 91.
Chen et al "The Layout Synthesizer an Automatic Netlist-To–Layout System," ACM/IEEE, pp. 232–238, 1989.

Takao Uehara et al., "Optimal Layout of CMOS Functional Arrays" IEEE Transactions on Computers, vol. C–30, No. 5, pp. 305–312, May, 1981.
Donald G. Baltus et al., "SOLO: A Generator of Efficient Layouts From Optimized MOS Circuit Schematics", 25th ACM/IEEE Design Automation Coference, pp. 445–452, 1988.
Charles J. Poirier, "Excellerator: Custom CMOS Leaf Cell Layout Generator", IEEE Transactions on Computer–Aided Design, vol. 8, No. 7, pp. 744–755 Jul., 1989.
Chi Yi Hwang et al., "An Efficient Layout Style for Two-Metal CMOS Leaf Cells and Its Automatic Synthesis", IEEE Transactions on Computer–Aided Design of Integrated Circuits and Systems, vol. 12, No. 3, pp 410–424, Mar. 1993.

Primary Examiner—Kevin J. Teska
Assistant Examiner—Vuthe Siek
Attorney, Agent, or Firm—McDermott, Will & Emery

[57] ABSTRACT

As a method for determining transistor palcement of a cell by using a computer, a degree of integratin of the cell equivalent to manual layout design can be realized and a processing can be performed within a practical time. At a one-dimensional placement step, transistors of the cell are placed in a string with vertical placement state in each channel region. At a two-dimensional placement step, conditions of the one-dimensional placement step are excluded, and the transistors can be placed in a plurality of strings with horizontal placement state in each channel region to strings with horizontal placement state in each channel region to change the transistor placement. Consequently, a result of the transistor placement obtained at the one-dimensional placement step can be improved and the cell can be made more compact. At the one-dimensional placement step, global optimization is performed. At the two-dimensional step, only local improvement of the placement is performed. Therefore, a burden on the computer can be relieved more considerably than in a method for placing transistors in two-dimensions from the beginning, and the processing can be performed within the practical time.

15 Claims, 27 Drawing Sheets

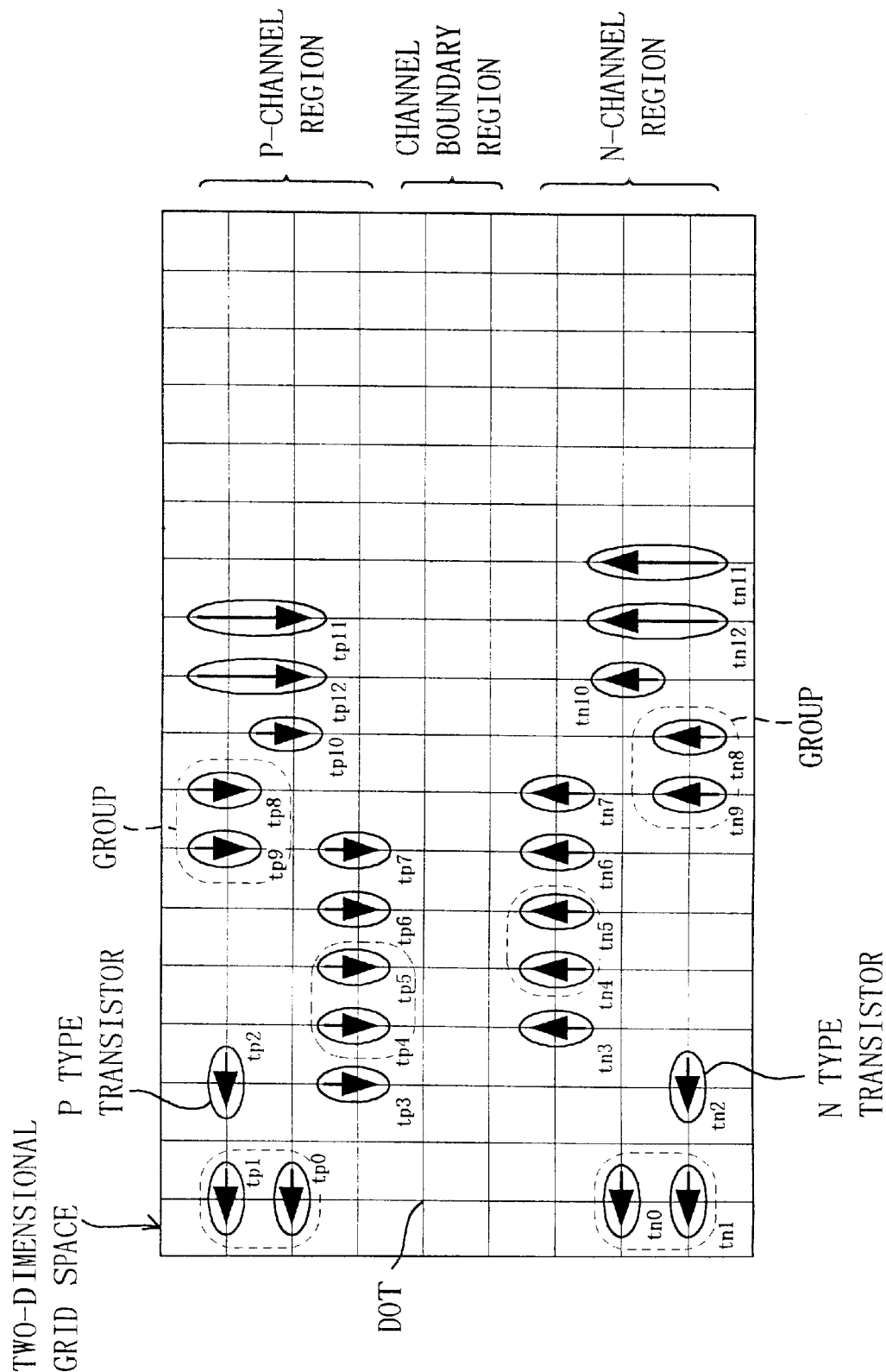

| x | L mnet | G mnet | R mnet | mssc | tr name |
|---|---|---|---|---|---|
| 0 | * | * | * | * | * |
| 1 | 19 | 5 | 16 | 16 | tp15 |
| 2 | * | * | * | * | * |
| 3 | 16 | 19 | 20 | 15 | tp16 |
| 4 | 16 | 18 | 17 | 11 | tp18 |
| 5 | 17 | 2 | 16 | 12 | tp17 |
| 6 | * | * | * | * | * |
| 7 | 16 | 5 | 2 | 29 | tp12 |
| 8 | * | * | * | * | * |
| 9 | 2 | 3 | 16 | 30 | tp13 |
| 10 | 16 | 3 | 0 | 25 | tp8 |
| 11 | 10 | 0 | 1 | 5 | tp9 |
| 12 | 1 | 7 | 2 | 2 | tp14 |
| 13 | * | * | * | * | * |
| 14 | * | * | * | * | * |
| 15 | 10 | 12 | 16 | 26 | tp7 |
| 16 | 16 | 1 | 5 | 28 | tp10 |
| 17 | 5 | 8 | 16 | 27 | tp11 |
| 18 | 16 | 10 | 13 | 23 | tp5 |
| 19 | 13 | 8 | 16 | 24 | tp4 |
| 20 | 16 | 7 | 15 | 8 | tp3 |
| 21 | 15 | 14 | 12 | 8 | tp19 |
| 22 | 12 | 0 | 13 | 7 | tp6 |
| 23 | 7 | 0 | 16 | 17 | tp1 |
| 24 | 7 | 16 | 0 | 19 | tp0 |
| 25 | * | * | * | * | |

| tr name | mssc | L mnet | G mnet | R mnet |
|---|---|---|---|---|
| tn15 | 14 | 19 | 5 | 6 |
| * | * | * | * | * |
| tn16 tn20 | 13 9 | 6 18 | 19 17 | 20 6 |
| tn19 | 10 | 17 | 2 | 6 |
| * | * | * | * | * |
| * | * | * | * | * |
| * | * | * | * | * |
| tn12 tn13 tn14 | 1 4 0 | 6 3 2 | 5 2 0 | 4 1 |
| tn9 | 4 | 1 | 7 | 10 |
| * | * | * | * | * |
| tn8 | 6 | 10 | 3 | 11 |
| tn7 tn10 tn11 | 6 3 3 | 11 6 9 | 12 1 8 | 6 9 5 |
| tn6 | 22 | 6 | 10 | 24 |
| tn4 | 22 | 24 | 7 | 23 |
| tn5 | 22 | 23 | 8 | 12 |
| tn2 tn18 tn1 | 21 21 18 | 12 22 7 | 14 0 0 | 22 6 6 |
| tn0 | 20 | 6 | 21 | 0 |

Fig. 26

| | | | | | | | | | | | | | | | | | | |
|---|---|---|---|---|---|---|---|---|---|---|---|---|---|---|---|---|---|---|
| L mnet | * | 8 | 3 | 2 | 3 | 12 | * | 7 | 10 | 3 | 17 | 11 | 16 | 3 | * | * | * | 4 |
| G mnet | * | 7 | 7 | 0 | 5 | 0 | * | 4 | 11 | 4 | 10 | 13 | 5 | 4 | * | * | * | 6 |
| R mnet | * | 3 | 0 | 3 | 12 | 7 | * | 10 | 3 | 17 | 11 | 16 | 3 | 5 | * | * | * | 3 |
| mssc | * | 11 | 12 | 1 | 13 | 13 | * | 14 | 15 | 19 | 19 | 18 | 18 | 4 | * | * | * | 5 |
| tr name | * | tp9 | tp8 | tp12 | tp7 | tp6 | * | tp5 | tp4 | tp3 | tp2 | tp1 | tp0 | tp11 | * | * | * | tp10 |
| x | 0 | 1 | 2 | 3 | 4 | 5 | 6 | 7 | 8 | 9 | 10 | 11 | 12 | 13 | 14 | 15 | 16 | 17 |
| tr name | * | tn9 | tn8 | tn12 | tn6 | tn5 | * | tn4 | tn3 | tn2 | tn1 | tn0 | tn7 | tn11 | * | * | * | tn10 |
| mssc | * | 6 | 7 | 0 | 8 | 8 | * | 9 | 10 | 17 | 17 | 16 | 16 | 2 | * | * | * | 3 |
| L mnet | * | 8 | 1 | 2 | 1 | 9 | * | 7 | 10 | 1 | 15 | 11 | 14 | 1 | * | * | * | 4 |
| G mnet | * | 7 | 7 | 0 | 4 | 0 | * | 5 | 11 | 5 | 10 | 13 | 4 | 4 | * | * | * | 6 |
| R mnet | * | 1 | 0 | 1 | 9 | 7 | * | 10 | 1 | 15 | 11 | 14 | 1 | 5 | * | * | * | 1 |

METHOD FOR GENERATING TRANSISTOR PLACEMENT IN AN AUTOMATIC CELL LAYOUT DESIGN

BACKGROUND OF THE INVENTION

The present invention relates to a layout synthesis technique of a LSI leaf cell such as a standard cell or a data pass leaf cell to be used for an electric circuit such as a CMOS'LSI, and more particularly to a method for determining placement of transistors in a cell area.

In recent years, a semiconductor process technology has been developed at the dizzying pace, and technological innovations have been made successively. Every time design and development of the most advanced high-performance system are projected in response to the technological innovations of a process, it is necessary to develop a new cell library. At the same time, there are various semiconductor processes. Each process is utilized according to use. For this reason, the cell library should also be prepared corresponding to the various processes. Also in design of a LSI system, high-speed operation, low power consumption and the like are targeted. The cell library should correspond to the various targets. In other words, the cell library has recently been developed very often. Actually, a great number of cells should be prepared for one library. Furthermore, a submicron era has began so that a mask design rule (design rule) has been complicated still more. Consequently, a reality with the development of the cell library has become more serious.

In development of a standard cell library and a private cell library for a data pass according to the prior art, layout design thereof has been obtained most manually. The reason is that a cell having a high degree of integration should be designed because the area of a leaf cell directly influences that of a block and furthermore that of a chip. In consideration of the reality related to the development of the cell library, it is apparent that manual layout design will not meet the needs of development in the near future. Accordingly, the cell layout synthesis technique will become more important rapidly.

Cell layout synthesis (cell synthesis) means that a mask layout having a transistor level is generated from a net list having the transistor level by using a design rule, and generally comprises three processings: (1) transistor placement; (2) a wiring between transistors; and (3) compaction. A cell synthesis method or a placement wiring method having the transistor level has conventionally been studied vigorously. However, most of these studies have great restrictions on an input circuit, a placement style of transistors and the like in order to simplify computer processings.

As an example of the restrictions, a one-dimensional placement model is employed. The one-dimensional placement model has the form in which P type transistors and N Type transistors are each placed in one string with the gate width direction fitting the vertical direction of a cell so that the two rows of P type and N type transistors is placed in parallel with each other in the cell. Since a lot of cells should be prepared for one cell library, transistors used for the cells have recently had various sizes. In the case where the one-dimensional placement model is employed under the circumstances, a rate of the cell which cannot form an optimal layout for a generally determined cell height in the cell library cannot be ignored. Accordingly, when developing a practical cell synthesis system, it is necessary to employ a method which is not restricted to the one-dimensional placement model. 'T. Uehara and W. M. vanCleemput, "Optimal Layout of CMOS Logic Cells", 25th ACM/IEEE Trans. Computer Vol. c-30, pp.305–312, May 1981' has proposed that a layout area can be reduced by sharing a diffusion layer between adjacent transistors. After that, there have been proposals including a relation of algorithms which maximize diffusion sharing to paring problems of P-type and N-type transistors. Most of the algorithms have the one-dimensional placement model as a premise.

A small number of methods having no one-dimensional placement model as a premise have been proposed. A method for generating cells variable in size in the vertical direction of the cells by repeatedly placing a pair of P channel region and N channel region in the cell and using a one-dimensional placement in each channel region has also been proposed. It is supposed that this method is more effective in a macro cell than a standard cell. On the other hand, a method which enables to arrange a plurality of transistors in the vertical direction of the cell in each of P and N channel regions into which the cell is divided as well as in the one-dimensional placement, and to change the number of arrangeable transistors depending on a position in the horizontal direction of the cell region has been described in 'C. J. Poirier, "Excellerator: Custom CMOS Leaf Cell Layout Generator", IEEE Trans. On Computer Aided Design Vol. 8, No. 7, pp. 744–755, July 1989'. It is supposed that this method is also effective in the standard cell. However, this method has restrictions, for example, directions of transistors should be arranged in the same direction, sizes of the transistors should be uniform and the like so that a degree of freedom equivalent to manual design is not dealt with. A method which also deals with a degree of freedom related to the directions of the transistors has been disclosed in 'D. G. Baltus, J. Allen, "SOLO: A Generator of Efficient Layouts From Optimized MOS Circuit Schematics", Design Automation Conference, pp. 445–452, 1988'. According to this method, a cell circuit is divided into partial circuits and a specific placement pattern (gate matrix style) is applied to the partial circuit so that the cell is not always optimized.

As described in 'Chi Yi Hwang, Yung-Ching Hsieh, Youn-Long Lin, Yu-Chin Hsu, "An Efficient Layout Style for Two-Metal CMOS Leaf Cells and Its Automatic Synthesis", IEEE Trans. on Computer-Aided Design of Integrated Circuits and Systems, Vol. 12, No. 3, pp. 410–424, March 1993', it is recognized that a cell height should be reduced in the same manner as a cell width in order to optimize a layout. A problem of optimizing a wiring in a cell which is a factor of determining the cell height has become important to transistor placement.

Various methods for optimizing a wiring between elements have been known by studies of optimal placement of a standard cell on a block and the like. Even if these methods are exactly applied to the problem of the transistor placement, a layout of the cell cannot be optimized. In order to optimize the cell while taking a cell width and a cell height into consideration, two optimization indexes, that is, optimization of diffusion and that of wirings by minimization of diffusion separation (maximization of diffusion sharing) should be dealt with at the same time. In the conventional transistor placement method, the two optimization indexes are not taken into consideration at the same time but optimization is divided into two stages in which first optimization is performed by one of the indexes and second optimization is performed by the other index. A typical method has been well known in which a partial circuit is extracted from a given circuit of a cell, transistors are placed in the extracted partial circuit in order to optimize diffusion, results of placement are regarded as transistor groups, and the transistor groups are placed in order to optimize a wiring.

The conventional method has a restriction that P type transistors and N type transistors are arranged vertically in a one-dimensional placement style. Thus, the transistors are placed on a horizontal dot string and the placement is evaluated by using grid coordinates. The above-mentioned document written by C. Y. Hwang has disclosed an example.

In order to apply cell synthesis performed by a computer to actual development of a cell library, it is necessary to solve a problem of a cell area, that is, a problem of how to increase a degree of integration of the cell equivalently to manual layout design. In order to solve this problem, it is necessary to give a complete two-dimensional degree of freedom by a transistor which acts as a placement element in the cell and to optimize a layout of the cell. In the conventional cell synthesis method, however, great restrictions are imposed on an input circuit, a placement style of transistors and the like so as to simplify computer processings as described above. Therefore, the conventional cell synthesis method is inadequate to realize a flexible layout equivalent to manual design.

If the complete two-dimensional degree of freedom is given to the transistors and the transistors are placed by the computer, it takes a lot of time to perform the processing. Therefore, such placement is not practical.

According to the transistor placement method according to the prior art, diffusion and wirings are separately optimized in two stages so that optimal transistor placement cannot always be obtained generally. In particular, the method for extracting partial circuits to group transistors has the following problem. If the number of the transistors of each group is great, a final result of transistor placement greatly depends on selection of the partial circuits. Consequently, there is a high possibility that the final result of placement might be optimized locally. Although a processing efficiency is high, some cells have a variation in a degree of optimization.

In the conventional method, P type transistors and N type transistors are placed on horizontal dot strings and grid coordinates are used to evaluate the placement on the condition that the transistors are vertically arranged in a one-dimensional placement style. According to an actual mask design rule, however, in the case where adjacent transistors share a diffusion electrode, a distance between gates obtained with a contact provided on the electrode is different from that obtained without the contact provided on the electrode. For this reason, the P type transistors and the N type transistors are not always arranged vertically in a layout obtained after compaction. There is also a possibility that an actual cell might include transistors having different gate lengths. In this case, it is impossible to arrange the P type transistors and the N type transistors vertically. In other words, the conventional transistor placement has a problem that the placement evaluation is not performed in conformity with a real layout.

SUMMARY OF THE INVENTION

It is an object of the present invention to provide a method for determining placement of transistors in a cell by using a computer in which global optimization is performed with one-dimensional placement and the placement is then improved locally with two-dimensional placement to realize a degree of integration of the cell equivalent to manual layout design and processings can be performed within a practical time.

It is another object of the present invention to provide a transistor placement method using a one-dimensional placement form in which placement of transistors is converted from a grid diagram to a mask diagram to perform placement evaluation in conformity with a real layout and the evaluation indexes serve to realize optimization of diffusion and wirings at the same time.

More specifically, the present invention provides a transistor placement method for determining placement of transistors in a cell region on the basis of a net list which describes information on connection of the transistors in a cell having at least one transistor and information on a size of each transistor, the cell having a vertical height set to a predetermined value, and a variable horizontal width, comprising a one-dimensional placement step of vertically dividing the cell region into a P-channel region and an N-channel region, placing, on the basis of the net list, P type transistors of the cell in the P-channel region in one string in the horizontal direction of the cell with vertical placement state in which the gate width direction fits the vertical direction of the cell, and N type transistors of the cell in the N-channel region in one string in the horizontal direction of the cell with the vertical placement state, and a two-dimensional placement step of changing the placement of the transistors for a result of transistor placement obtained at the one-dimensional placement step so as to reduce a width of the cell, on condition that in each channel region, the transistors are placeable in a plurality of strings in the horizontal direction of the cell and with horizontal placement state in which the gate width direction fits the horizontal direction of the cell.

At the one-dimensional placement step, consequently, the transistors of the cell are placed in a string with the vertical placement state in each of the P-channel region and the N-channel region. In case of the form of placement having such conditions, the placement of the transistors can be executed easily by a computer within a practical time, and can be optimized to some extent. At the two-dimensional placement step, the conditions of the one-dimensional placement step are excluded, and the transistors can be placed in a plurality of strings in the horizontal direction of the cell and can be placed with the horizontal placement state in each channel region to change the transistor placement such that the width of the cell is reduced. Consequently, the result of the transistor placement obtained at the one-dimensional placement step can be improved and the cell can be made more compact. Thus, a degree of integration of the cell equivalent to manual layout design can be realized. At the one-dimensional placement step, global optimization has already been performed. At the two-dimensional placement step, therefore, only local improvement of the transistor placement is performed. Consequently, a burden on the computer can be relieved more considerably than in a method for placing transistors in two-dimensions from the beginning, and a processing can be performed within the practical time.

Preferably, the transistor placement method further comprises a group forming step of extracting, from the net list, transistors of the same conductivity type in which diffusion electrodes form serial connection having no branch, and collecting the extracted transistors into a group, wherein the one-dimensional placement step and the two-dimensional placement step place, as a single placement element, the transistors collected into the group at the group forming step.

Consequently, the transistors of the same conductivity type in which the diffusion electrodes form the serial connection having no branch are collected into the group. A layout of the transistors of the same conductivity type in which the diffusion electrodes form the serial connection having no branch is represented by a diffusion island. This layout is not changed also in the case where the transistor placement of the whole cell is optimized. In other words, the transistor placement in the group is determined in a sense. For this reason, even if the transistors collected into the group are treated as the single placement element, optimization of the transistor placement in the whole cell is not affected. Accordingly, the transistors collected into the group are treated as the single placement element, a burden on the computer in a transistor placement processing can be relieved without interfering with the optimization of the transistor placement in the whole cell.

Preferably, the one-dimensional placement step and the two-dimensional placement step include a step of dividing a wiring of each net into a plurality of components on the basis of positioning in the net, estimating wiring lengths for each component, and adding values obtained by weighting estimated values of the wiring lengths of each component to use the sum as the evaluation index of the transistor placement.

Consequently, in the case where the transistors are used as the placement element, the wiring length can be evaluated precisely.

Preferably, in the transistor placement method, the cell is a MOS logic cell, further comprising a stage setting step of setting, for each transistor, a stage representing the number of gates on a path from the transistor to a signal output terminal associated with the transistor, on the basis of the net list, the one-dimensional placement step determining order of placement of the transistors by using the stages of each transistor set at the stage setting step.

Consequently, when performing the one-dimensional placement of the transistors, information on a circuit can be reflected by using a concept of a stage. Thus, an efficiency of the one-dimensional placement processing can be increased.

Preferably, the transistor placement method further comprises a transistor folding step of obtaining a wiring density of a horizontal wiring component for each placement position of the transistor in the horizontal direction of the cell from the result of the transistor placement obtained at the one-dimensional placement step, dividing, by gate folding, the transistor placed on one of transistor placement positions when a layout height obtained by adding a transistor height and the wiring density of the horizontal wiring component in the transistor placement position exceeds a preset value of a cell height, and correcting the result of the transistor placement obtained at the one-dimensional placement step by using the divided transistor as a new placement element.

Consequently, the folding of the transistor is performed in consideration of the wiring density obtained from the result of the transistor placement at the one-dimensional placement step. Consequently, the folding of the transistor can be performed in conformity with a real layout.

The present invention provides a transistor placement method for determining placement of transistors in a cell region on the basis of a net list which describes information on connection of the transistors in a cell having at least one transistor and a mask design rule lead by a semiconductor manufacturing technique, comprising a first step of arranging a plurality of dots in a horizontal direction of the cell to set a dot string, setting a P-channel region to place P type transistors and an N-channel region to place N type transistors in parallel with the dot string, placing, on the basis of the net list, the P type transistors of the cell on the dot positions in the P-channel region, only one P type transistor being placed on one dot position, and the N type transistors of the cell on the dot positions in the N-channel region, only one N type transistor being placed on one dot position, thereby forming transistor placement on the dot string, a second step of placing the transistors on a mask diagram so as to meet the mask design rule in order from one of sides to the other side in the horizontal direction of the cell in each channel region on the basis of the transistor placement on the dot string, thereby forming the transistor placement on the mask diagram, and a third step of evaluating the transistor placement on the mask diagram formed at the second step and, on the basis of the result of evaluation, changing the transistor placement on the dot string which is a base of the evaluated transistor placement on the mask diagram, the second and third steps being repeated, the second step, at the beginning of repetition, forming the transistor placement on the mask diagram from the transistor placement on the dot string formed at the first step and, on and after second repetition forming the transistor placement on the mask diagram from the transistor placement on the dot string changed at the third step.

Consequently, the transistor placement on the dot string is converted into the transistor placement on the mask diagram so as to be evaluated. The transistor placement is changed on the basis of the result of the evaluation. Thus, the placement is evaluated in conformity with a real layout.

Preferably, the second step determines a placement position of one of the transistors on the mask diagram, on the basis of a placement position on the mask diagram of a transistor provided on an adjacent dot position on the one side in the same channel region if any, and if not, on the basis of a placement position on the mask diagram of a transistor provided on the same dot position in a different channel region and having a placement position on the mask diagram determined.

Consequently, in the case where the transistor is placed on the dot position on one of sides in the same channel region, a placement position of a transistor on the mask diagram is determined on the basis of the placement position on the mask diagram of the transistor placed in the same channel. If the transistor is not placed in the same channel but a transistor is placed on the same dot position and a placement position thereof on the mask diagram has already been determined in a different channel region, a placement position of a transistor on the mask diagram is determined on the basis of the placement position on the mask diagram of the transistor placed in the different channel. Consequently, the transistor placement on the dot string can be reflected still more on the mask diagram comparatively in conformity with a real layout than in a method for simply compacting the transistors toward one of sides in each channel region or a method for fitting the positions of the P type transistor and the N type transistor placed on the same dot.

The third step includes a step of dividing an extension of each net on the mask diagram into a plurality of parts on the basis of electrodes of transistors forming the net, estimating the extension in each part, and evaluating the transistor placement on the mask diagram by using, as an evaluation index, the sum of values obtained by weighting estimated values of each part.

Consequently, the position of the electrode of the transistor is reflected, as the evaluation index of the transistor placement on the mask diagram, on the extension of the net. In addition, the extension of the diffusion electrode is the index for evaluating a degree of diffusion sharing. Thus, the wiring and the diffusion can be optimized at the same time.

BRIEF DESCRIPTION OF THE DRAWINGS

FIG. 10 is a diagram showing a result obtained by executing the processing of optimizing the two-dimensional placement of transistors;

FIG. 20 is a chart showing an example of data indicative of the placement on the dot string;

FIG. 26 is a chart showing placement on a dot string obtained by executing a transistor placement method according to a fourth embodiment of the present invention for the circuit in FIG. 4.

DETAILED DESCRIPTION OF THE INVENTION

The present invention relates to a cell layout synthesis technique, and more particularly to a proposal for a new method for a transistor rough placement technique.

Figure 1:
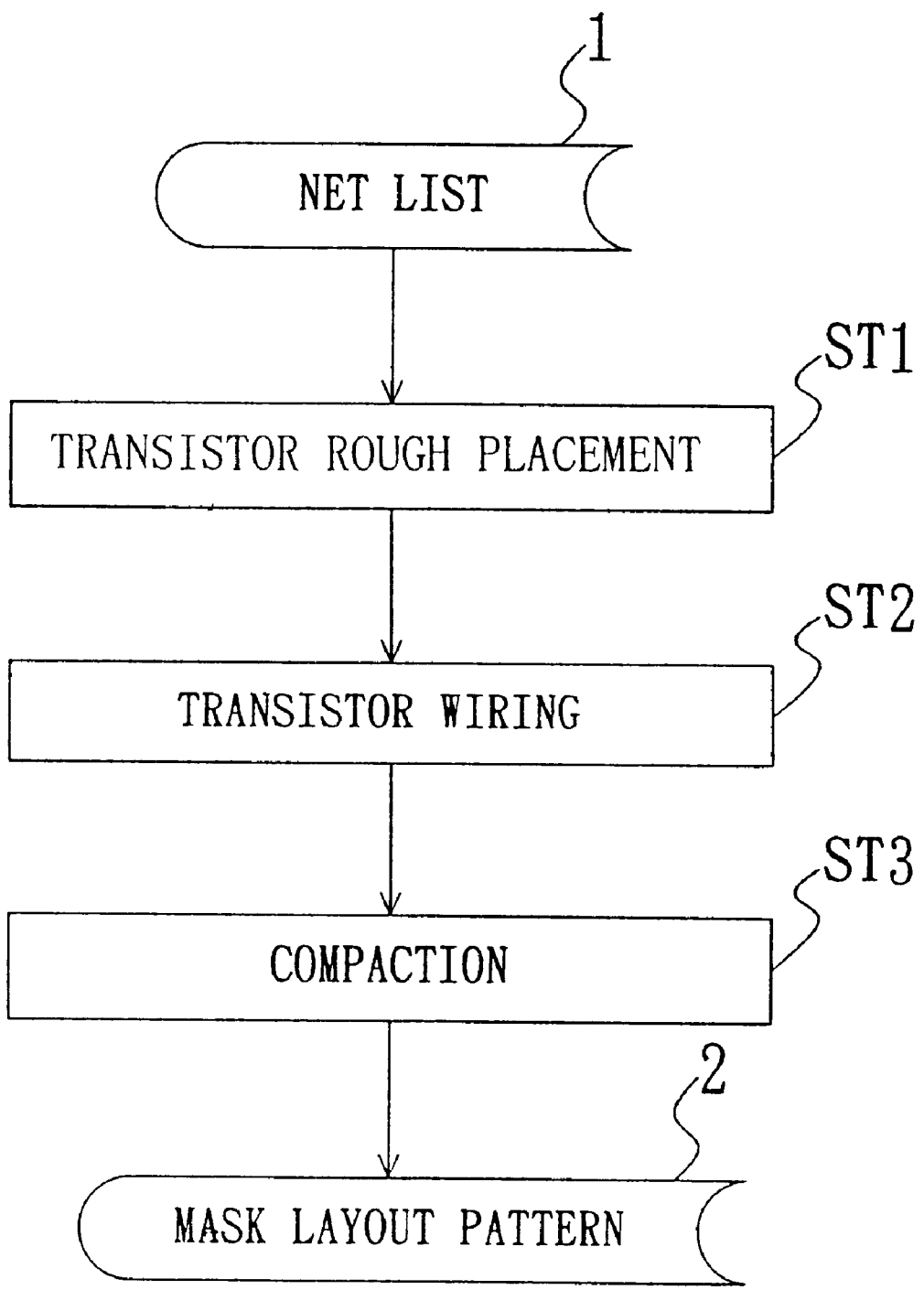
FIG. 1 is a flowchart showing a flow of a processing of a cell layout synthesis (cell synthesis) method.

FIG. 1 is a flowchart showing a flow of a processing of a cell layout synthesis (cell synthesis) method. As shown in FIG. 1, cell synthesis means that a mask layout pattern 2 having a transistor level of a cell is generated, by using a mask design rule, from a net list 1 having the transistor level which describes the cell. In general, the cell synthesis method comprises three steps, that is, a transistor rough placement step ST1, a transistor wiring step ST2 and a compaction step ST3. The transistor rough placement step ST1 is a processing of determining rough placement positions of transistors in a cell by inputting the net list 1 having the transistor level. Rough placement means that the placement position of the transistor in the cell is not finally determined at the transistor rough placement step ST1 but a wiring path which meets the needs of connection between the transistors is found at the transistor wiring step ST2 based on a rough placement result obtained at the transistor rough placement step ST1, and the mask layout pattern 2 including the wiring is determined according to the mask design rule at the compaction step ST3 so that the final placement position of the transistor is determined. A transistor placement method according to the present invention is defined as execution of the transistor rough placement in the cell synthesis.

The transistor placement method according to embodiments of the present invention will be described below with reference to the drawings.

Figure 2:
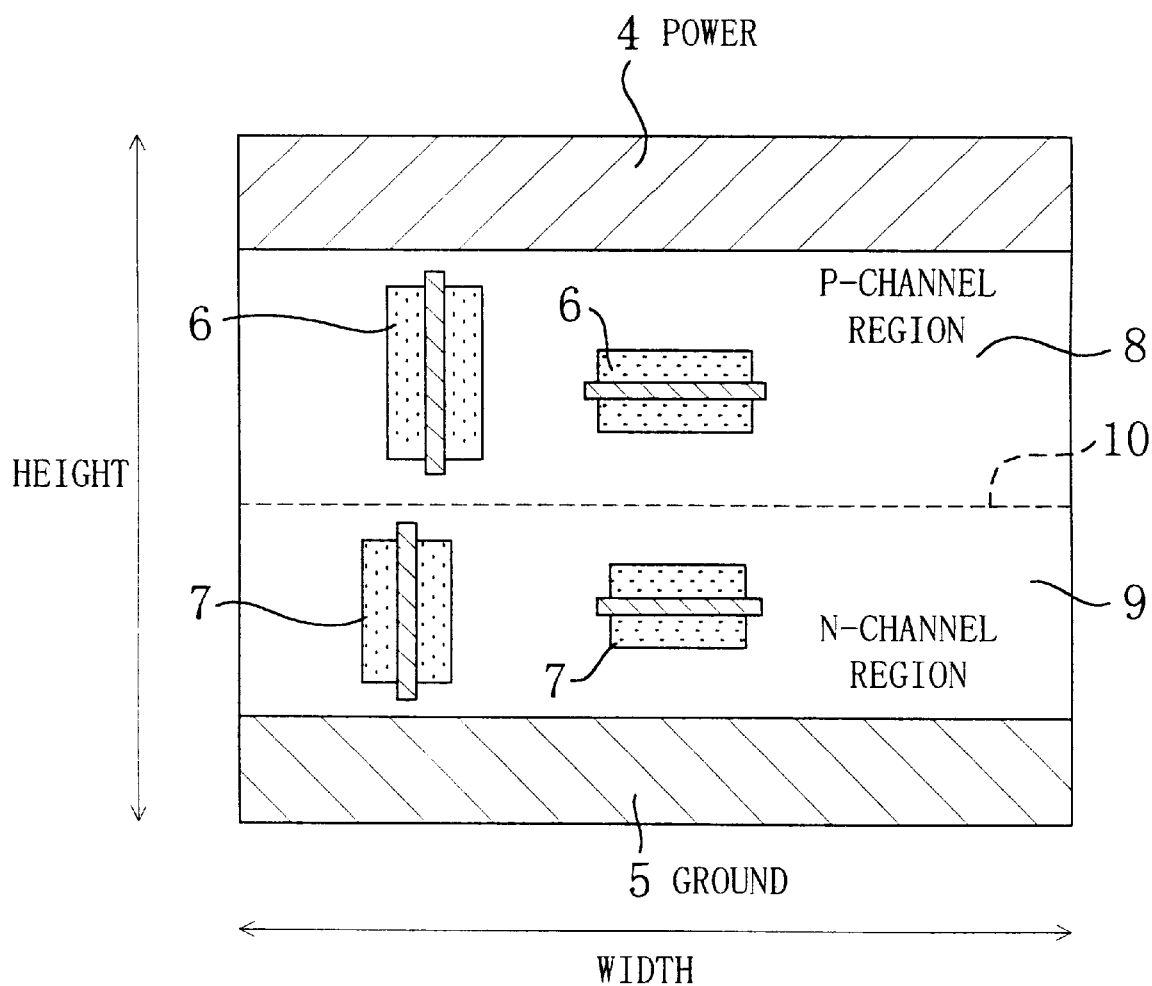
FIG. 2 is a diagram showing a cell model targeted by a transistor placement method according to the present invention.

FIG. 2 is a diagram showing a cell model targeted by the transistor placement method according to the present invention. According to the present invention, a general design style of a standard cell is assumed. As shown in FIG. 2, a target cell has a vertical height having a predetermined constant value, and a horizontal width having a variable value. A power wiring 4 and a ground wiring 5 are provided on upper and lower ends of the cell. A region between the power wiring 4 and the ground wiring 5 is divided into two parts. An upper region is a P-channel region 8 where a P type transistor 6 is to be placed, and a lower region is an N-channel region 9 where an N type transistor 7 is to be placed. The P-channel region 8 and the N-channel region 9 are divided by a channel boundary 10.

The case where a direction of a gate width of the placed transistor is the same as a vertical direction of the cell will be hereinafter referred to as vertical placement state of the transistors. The case where the direction of the gate width of the placed transistor is the same as a horizontal direction of the cell will be hereinafter referred to as horizontal placement state of the transistors.

Positions of input-output terminals of the cell are not preset but are schematically set on the basis of a result of the placement of the transistors.

In a system for executing the transistor placement method according to the present invention, an input and an output are as follows.

[Input]

(1) A net list having a transistor level. The number of the transistors to be placed in the two channel regions may be different from each other.

(2) A mask design rule led from an applied process technology. The transistor placement method determines the placement of the transistors. When evaluating the placement, a wiring density, diffusion sharing/separation and the like should be changed to numeric values on a mask size basis. Therefore, the mask design rule is referred.

[Output]

Positions of the rough placement including directions of the transistors in the cell.

FIRST EMBODIMENT

A transistor placement method according to the present embodiment serves to combine one-dimensional placement and two-dimensional placement to optimize the placement of transistors.

The one-dimensional placement of the transistors means that P type transistors are placed in a horizontal string with vertical placement state (with directions of gate widths arranged vertically) in a P-channel region and N type transistors are placed in a horizontal string with the vertical placement state in an N-channel region to form one transistor string for each channel region. The two-dimensional placement of transistors means that a complete two-dimensional degree of freedom is given to the transistors in each channel region by excluding conditions of the one-dimensional placement.

In a cell library of a standard cell, the one-dimensional placement of transistors having a standard size is assumed to set a cell height. For this reason, the transistors of the standard cell should be placed on the basis of a style of the one-dimensional placement. However, if a result obtained by the one-dimensional placement of the transistors is exactly expanded into a mask layout, a nonconformity is caused. For example, sizes of the transistors used in one cell library are enlarged and a variation in the sizes of the transistors used for one cell is increased so that a great space area is formed on a layout.

In order to solve this problem, the transistor placement method according to the present embodiment is characterized in that a result of placement of transistors which is globally optimized by one-dimensional placement is locally corrected by two-dimensional placement to reduce a space area which might be generated as a result of only the one-dimensional placement so that a mask layout having a higher degree of integration can be realized.

Figure 3:
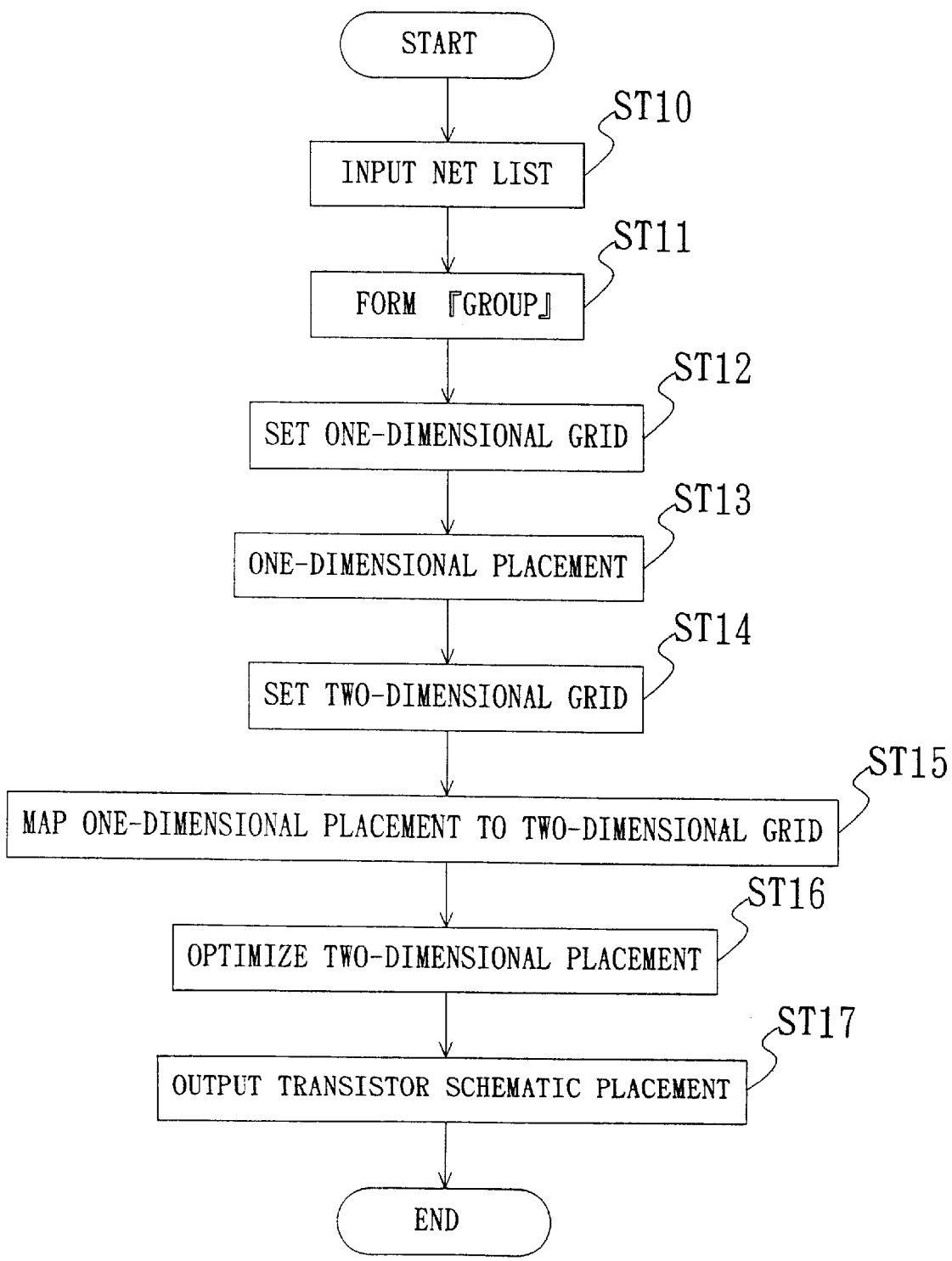
FIG. 3 is a flowchart showing a flow of a processing of a transistor placement method according to a first embodiment of the present invention.

FIG. 3 is a flowchart showing a flow of a processing of the transistor placement method according to the first embodiment of the present invention, which corresponds to the transistor rough placement step ST1 in the cell synthesis method shown in FIG. 1. The transistor placement method according to the present embodiment will be described below with reference to FIG. 3.

Figure 4:
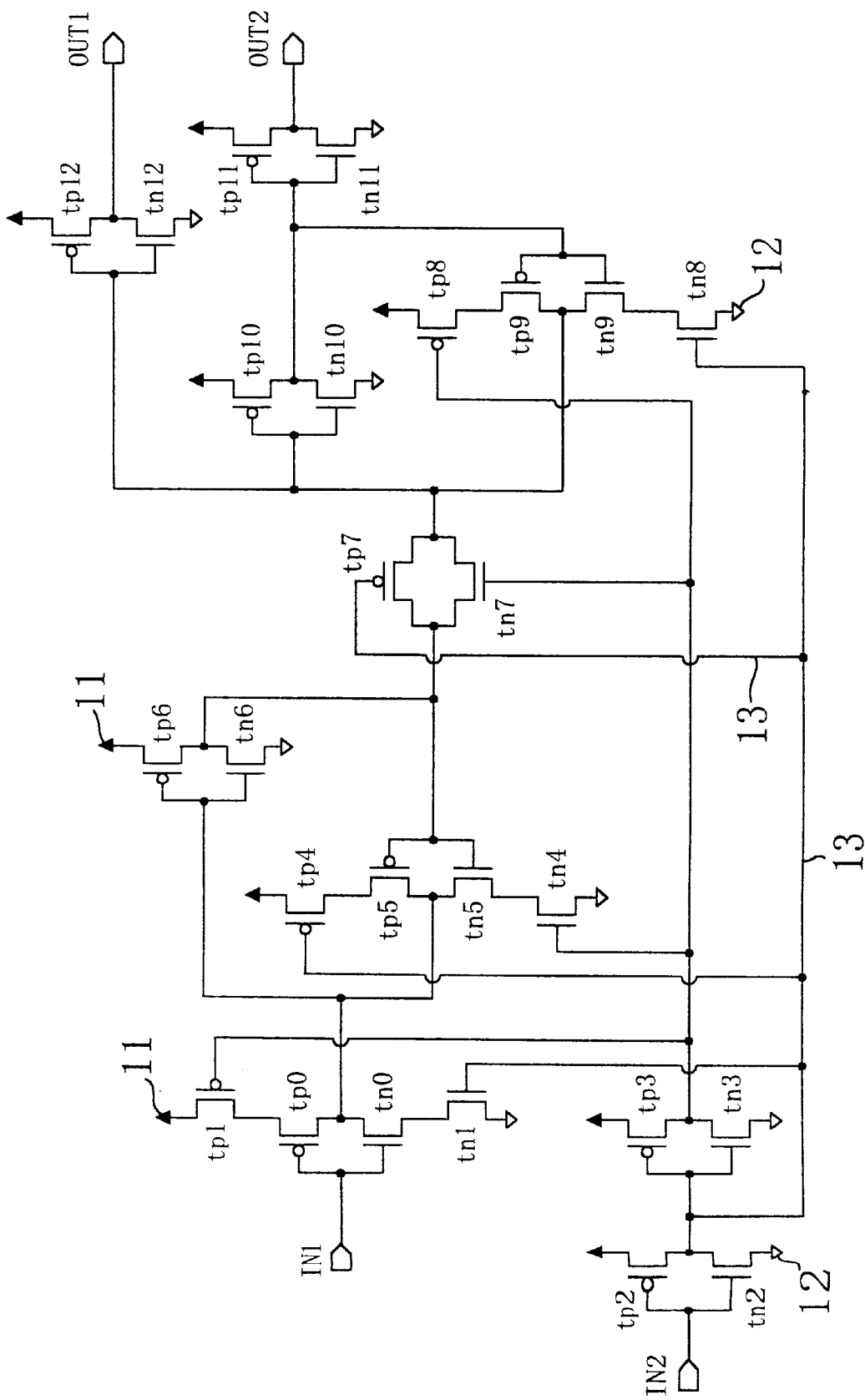
FIG. 4 is a schematic diagram showing an example of a circuit represented by a net list.

At Step ST10, a net list which describes a cell is read and information on a request for connection between the transistors and on sizes of the transistors is stored. FIG. 4 is a schematic diagram showing an example of a circuit represented by the input net list. In FIG. 4, tp0 to tp12 denote P type transistors, tn0 to tn12 denote N type transistors, IN1 and IN2 denote input terminals, OUT1 and OUT2 denote output terminals, 11 denotes a power supply, 12 denotes a ground, and 13 denotes a connecting relationship. In the net list, information on a size of each transistor is described in addition to information on the connecting relationship 13 shown in FIG. 4.

At Step ST11, grouping (clustering) of the transistors is performed. The grouping of the transistors is performed in order to hierarchically process the placement of the transistors. A plurality of transistors are collected into a group on the circuit and a problem of the placement of the transistors is divided into a problem of the placement of the transistors in the group and that of placement of the groups so as to efficiently obtain a solution of the problem of the placement of the transistors. Step ST11 forms a group forming step.

Attention should be paid to a method for determining the groups, that is, conditions for grouping the transistors. The reason is that there is a possibility that the placement of the transistors in the group might not be adequate depending on the result of the placement of the groups in the case where the placement of the transistors in the group has many choices.

In the present embodiment, therefore, only the transistors connected with a simple serial relationship having no branch are grouped such that the placement of the transistors in the group includes no optionality. In other words, transistors of the same conductivity type in which diffusion electrodes form serial connection having no branch are collected into one group. The transistors which do not form the serial connection are considered to solely form serial connection in a broad sense, and are regarded as a group formed by a single transistor.

Figure 5:
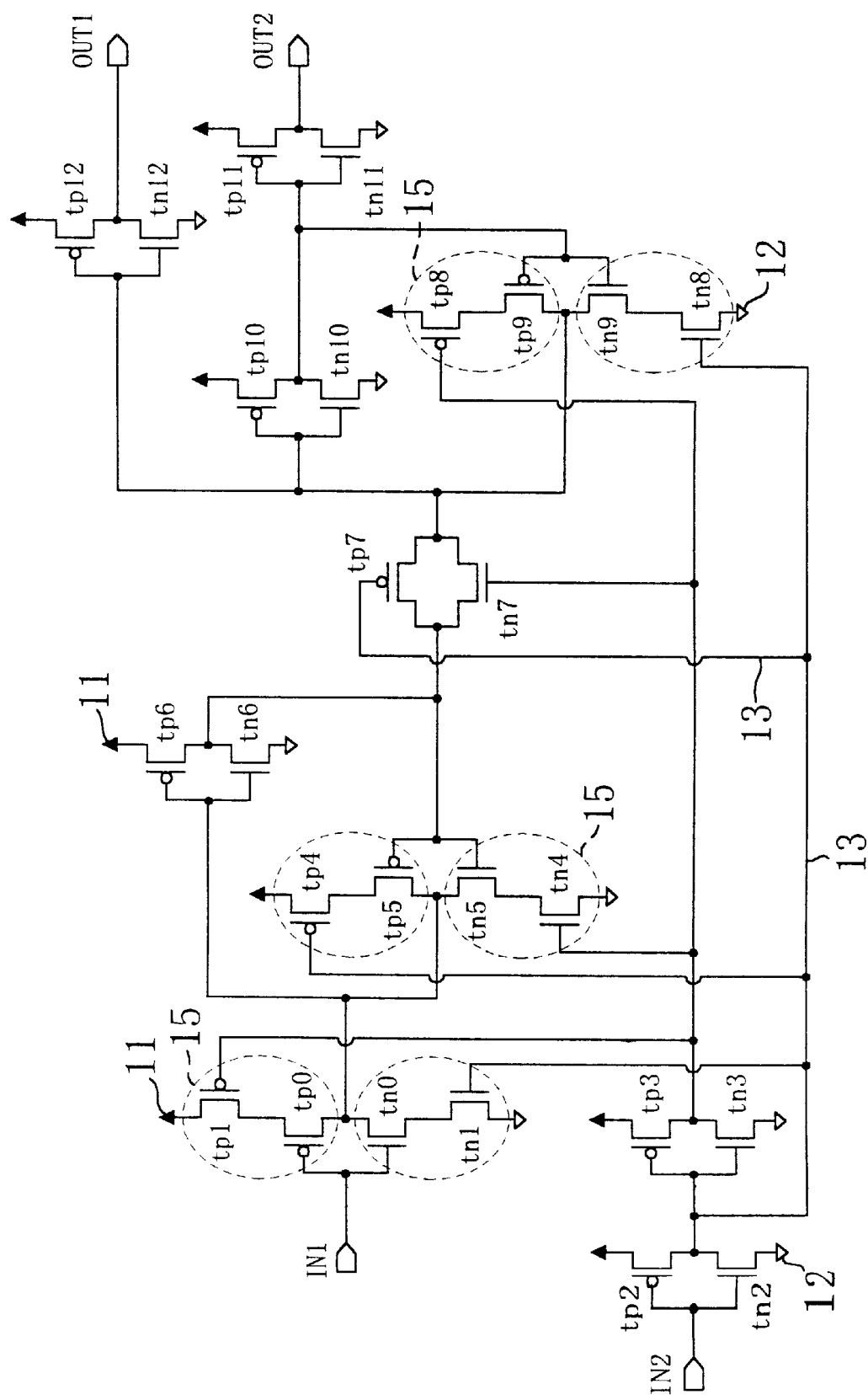
FIG. 5 is a diagram showing a result obtained by executing a group forming processing according to the present invention for the circuit shown in FIG. 4.

FIG. 5 is a diagram showing a result obtained by executing the group forming step ST11 for the circuit in FIG. 4. In FIG. 5, a broken line enclosing a plurality of transistors together shows a group 15. More specifically, the following six groups are formed.

(tp0, tp1), (tp4, tp5), (tp8, tp9)
(tn0, tn1), (tn4, tn5), (tn8, tn9)

All other groups are formed by a single transistor, respectively.

If the transistors which are connected with the simple serial relationship having no branch, that is, the transistors of the same conductivity type in which diffusion electrodes form the serial connection having no branch are grouped, all interconnection among the transistors in a group is 2-terminal connection. Therefore, the transistors belonging to one group can always be placed in one diffusion island. In addition, it is not necessary to interpose a contact between the transistors.

Figure 6A:
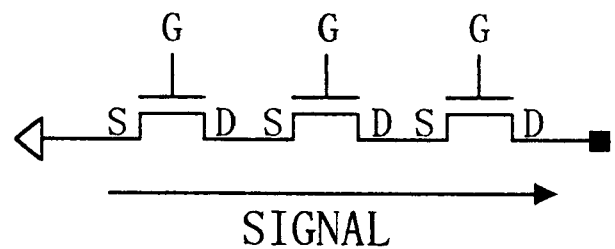
FIG. 6 explains transistor placement in a group formed by the group forming processing according to the present invention, FIG. 6(a) showing transistors belonging to a group and FIG. 6(b) showing a layout of the transistors in FIG. 6(a)
Figure 6B:
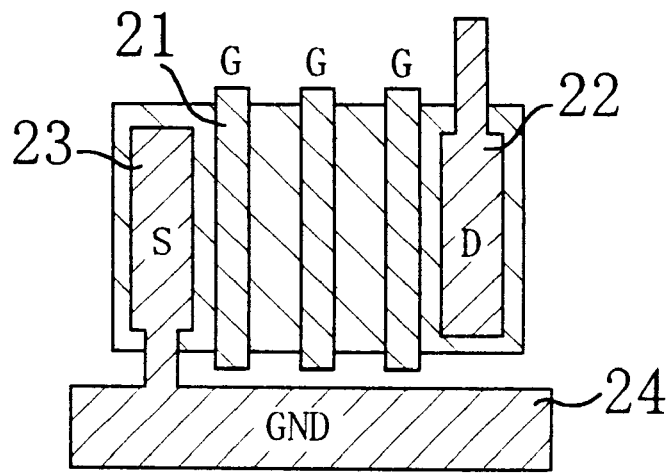
Figure 21:
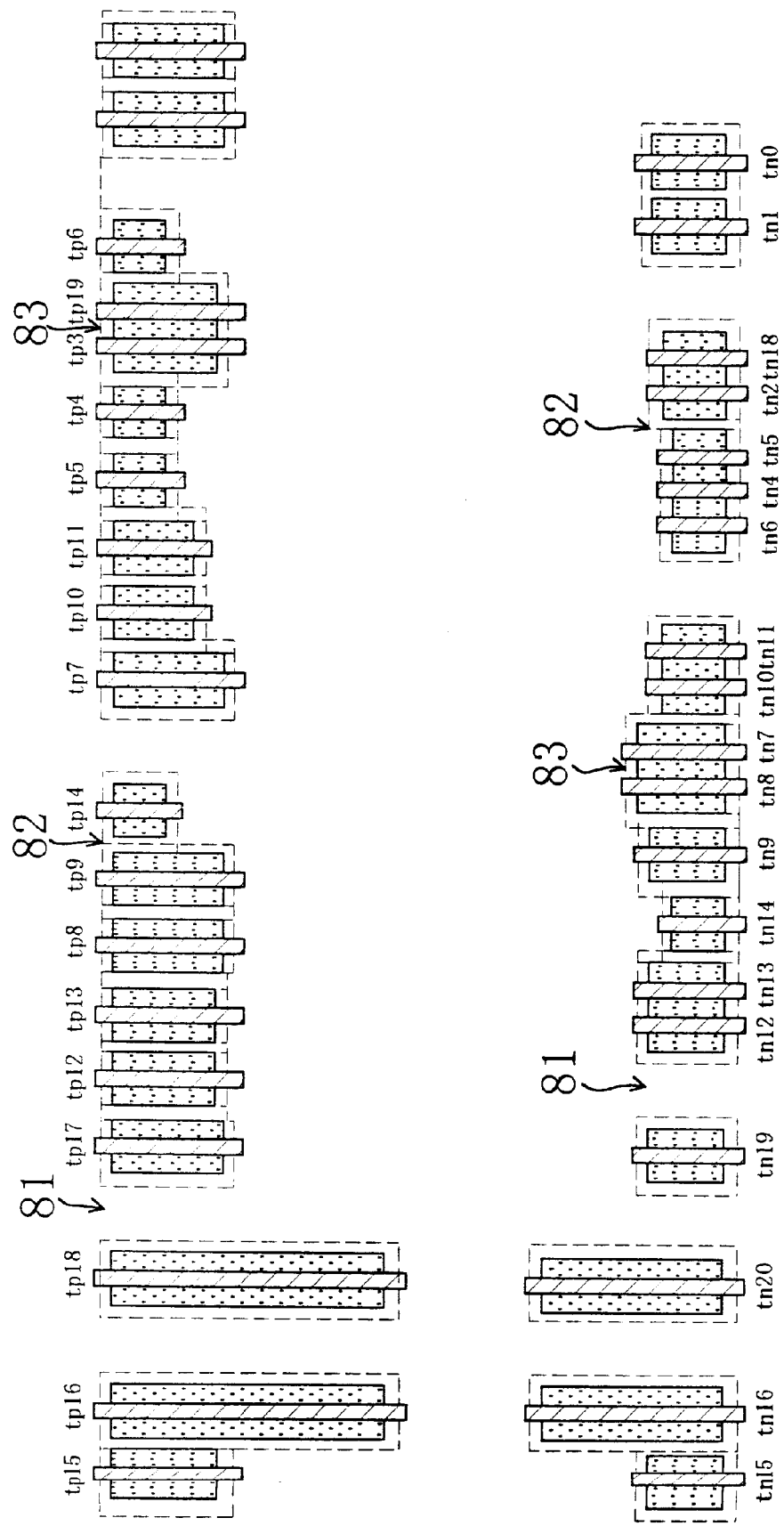
FIG. 21 shows a result obtained by converting the placement on the dot string in FIG. 20 into placement on a mask diagram by a converting method according to the prior art.

FIG. 6 explains placement of transistors in a group, FIG. 6(a) showing transistors belonging to one group according to the present embodiment, that is, the transistors connected with a simple serial relationship having no branch, and FIG. 6(b) showing a layout of the transistors belonging to the group in FIG. 6(a). In FIG. 6(b), 21 denotes a gate electrode, 22 denotes a diffusion electrode (drain), 23 denotes a diffusion electrode (source), and 24 denotes a ground wiring. When the transistors belonging to the group shown in FIG. 6(a) are placed in order so as to trace the serial connection of the diffusion electrodes, a diffusion island shown in FIG. 6(b) is obtained.

For a layout of the transistors connected with the simple serial relationship having no branch, the form of the diffusion island shown in FIG. 6(b) is an optimal solution. It is supposed that the transistors connected with the simple serial relationship having no branch are always placed as the diffusion island shown in FIG. 6(b) also in the optional solution of the placement of the transistors in the whole cell. In the case where grouping according to the present embodiment is performed, it is supposed that optimization of the placement of the transistors in the whole cell is not deteriorated even if mutual placement of the transistors belonging to each group is specified from beginning. Accordingly, such grouping is executed as a preprocessing of a transistor placement step and the transistors collected into one group are placed as single placement elements so that a burden on a processing of optimizing the placement of transistors can be relieved. The grouping according to the present embodiment is effective as a minimum requirement to optimize the placement of the transistors in the cell.

Steps ST12 and ST13 form a one-dimensional placement step, and Steps ST14 to ST16 form a two-dimensional placement step.

First of all, the one-dimensional placement step will be described below. At the one-dimensional placement step according to the present embodiment, a one-dimensional grid space which extends horizontally in the cell is set, and each transistor forming the cell on the set one-dimensional grid space is placed on one of dots. At this time, the transistors are placed by using a wiring length or a wiring density as an evaluation index so as to generate an enough space area to optimize the placement of the transistors at the two-dimensional placement step to be performed successively.

At Step ST12, the one-dimensional grid space which extends horizontally is set in the cell. At Step S13, optimal allocation of each transistor forming the cell to the one-dimensional grid space is determined to place each transistor on one of the dots of the one-dimensional grid space.

Figure 7:
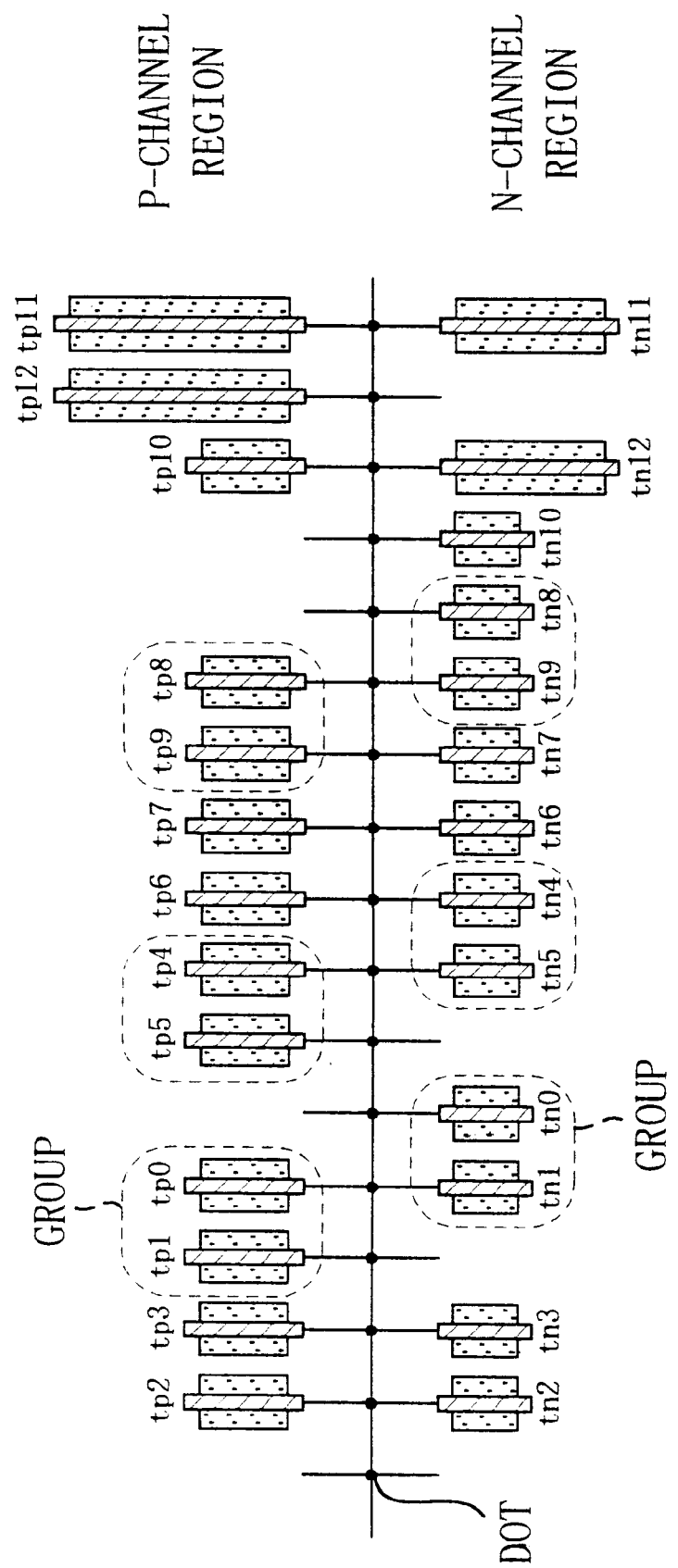
FIG. 7 is a diagram showing a one-dimensional grid space and a one-dimensional placement model of transistors, which corresponds to the circuit shown in FIG. 5.

FIG. 7 is a diagram showing the one-dimensional grid space and the one-dimensional placement of the transistors, which corresponds to the circuit shown in FIG. 5. As shown in FIG. 7, a P type transistor and an N type transistor can be placed on a dot. Each transistor is provided on each dot with the vertical placement state. A distance between the dots is separately set in a P-channel region and an N-channel region. In the sate channel region, the distance is set so as to be varied in the cases where adjacent transistors share diffusion and where they do not share the diffusion.

The two-dimensional placement step will be described below. The two-dimensional placement step according to the present embodiment is defined as a postprocessing of the one-dimensional placement step so as to obtain practical optimization including a problem of a processing time. In each channel region, the transistors can be placed in a plurality of strings horizontally in the cell and the transistors can be provided with horizontal placement state in which a horizontal direction of the cell is the same as that of a gate width to locally change the placement of the transistors such that a width of the cell is reduced. In other words, the transistor placement method according to the present embodiment is characterized in that global optimization is performed with the one-dimensional placement and the two-dimensional placement is then performed in order to locally improve a result of the one-dimensional placement.

At Step ST14, a two-dimensional grid space is set to prepare the two-dimensional placement of the transistors. On the two-dimensional grid space, the transistor which acts as a placement element is represented by a directed segment having a direction and a length based on the gate width. The two-dimensional placement of the transistors is performed by allocating the directed segment representing the transistor to each dot on the two-dimensional grid space without overlap.

Figure 8:
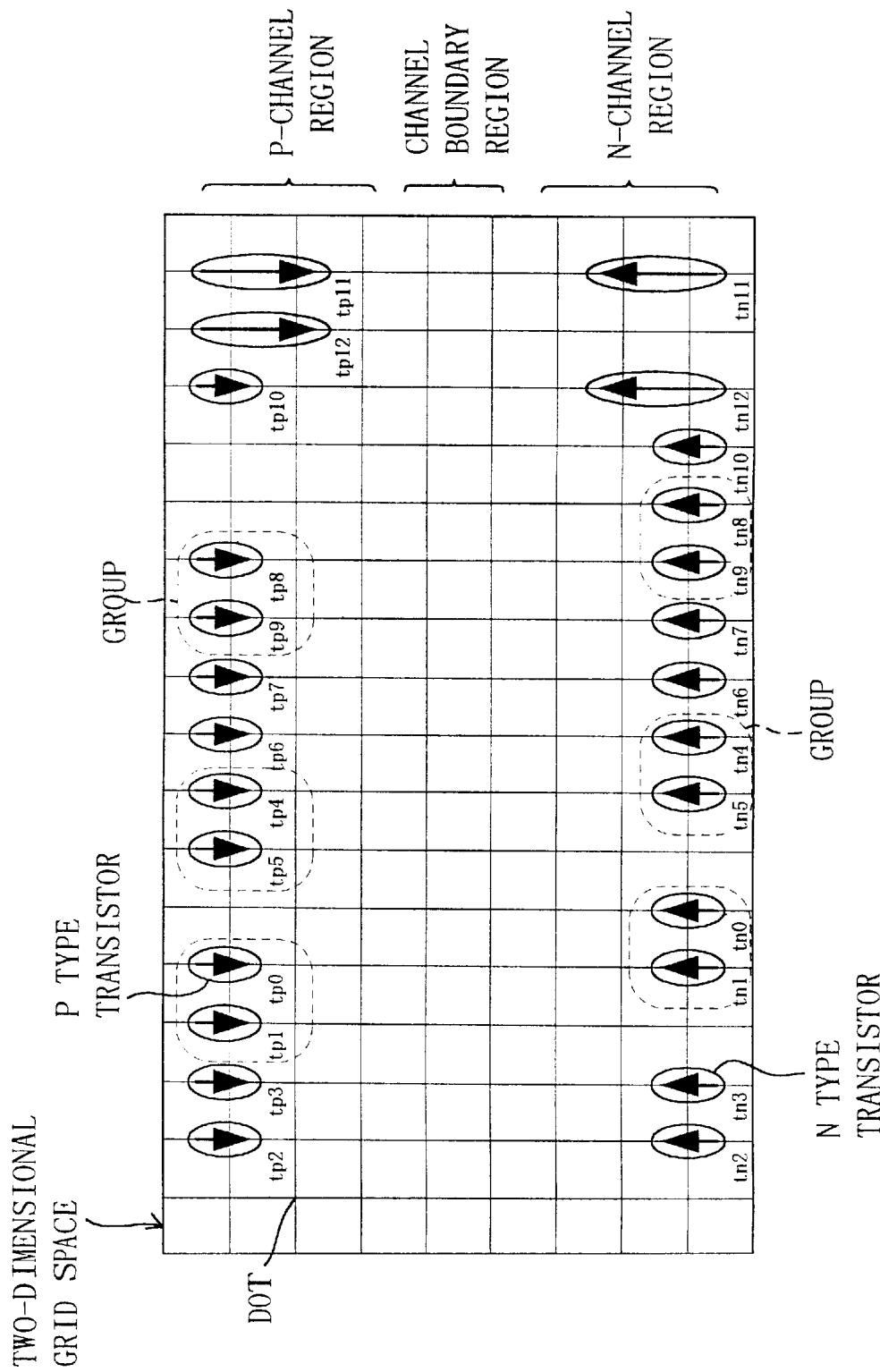
FIG. 8 is a diagram showing a result obtained by mapping a result of the one-dimensional placement of transistors shown in FIG. 7 to a two-dimensional grid space.

At Step ST15, the result of the one-dimensional placement of the transistors obtained at Step ST13 is first mapped to the two-dimensional grid space. FIG. 8 is a diagram showing a result obtained by mapping, to the two-dimensional grid space, the result of the one-dimensional placement of the transistors shown in FIG. 7, that is, that of the one-dimensional placement for the circuit shown in FIG. 4. As shown in FIG. 8, the directed segment representing each transistor is allocated to each dot on the two-dimensional grid space. The P type transistor is allocated to each grid in the P-channel region, and the N type transistor is allocated to each dot in the N-channel region.

By using a result of mapping shown in FIG. 8 as initial placement, the two-dimensional placement of the transistors is optimized at Step ST16. The two-dimensional placement of the transistors is optimized by repeatedly changing the placement of the transistors while evaluating the placement of the transistors on a mask (real layout). The placement of the transistors is changed for each group. The transistors left alone during grouping are regarded as groups, each of which is formed by only one transistor. In the case where the transistors are not grouped, the placement can be changed for each transistor.

More specifically, the placement is changed as follows. First of all, a group to be moved (hereinafter referred to as a group A) is selected at random. Then, a dot to which the group A is to be moved is selected at random. At this time, a range of selection of the dot to which the group A is to be moved may be restricted. When the group A is moved to the selected dot, it is verified whether or not the group A overlaps with other groups. If the group A does not overlap with other groups, the group A is moved to the selected dot. If the group A overlaps with the other group (hereinafter referred to as a group B), it is verified whether or not the placement of the group A can be exchanged for that of the group B. If the placement of the group A can be exchanged for that of the group B, they are exchanged. If the placement of the group A cannot be exchanged for that of the group B, movement of the group A to the same dot is stopped.

Figure 9:
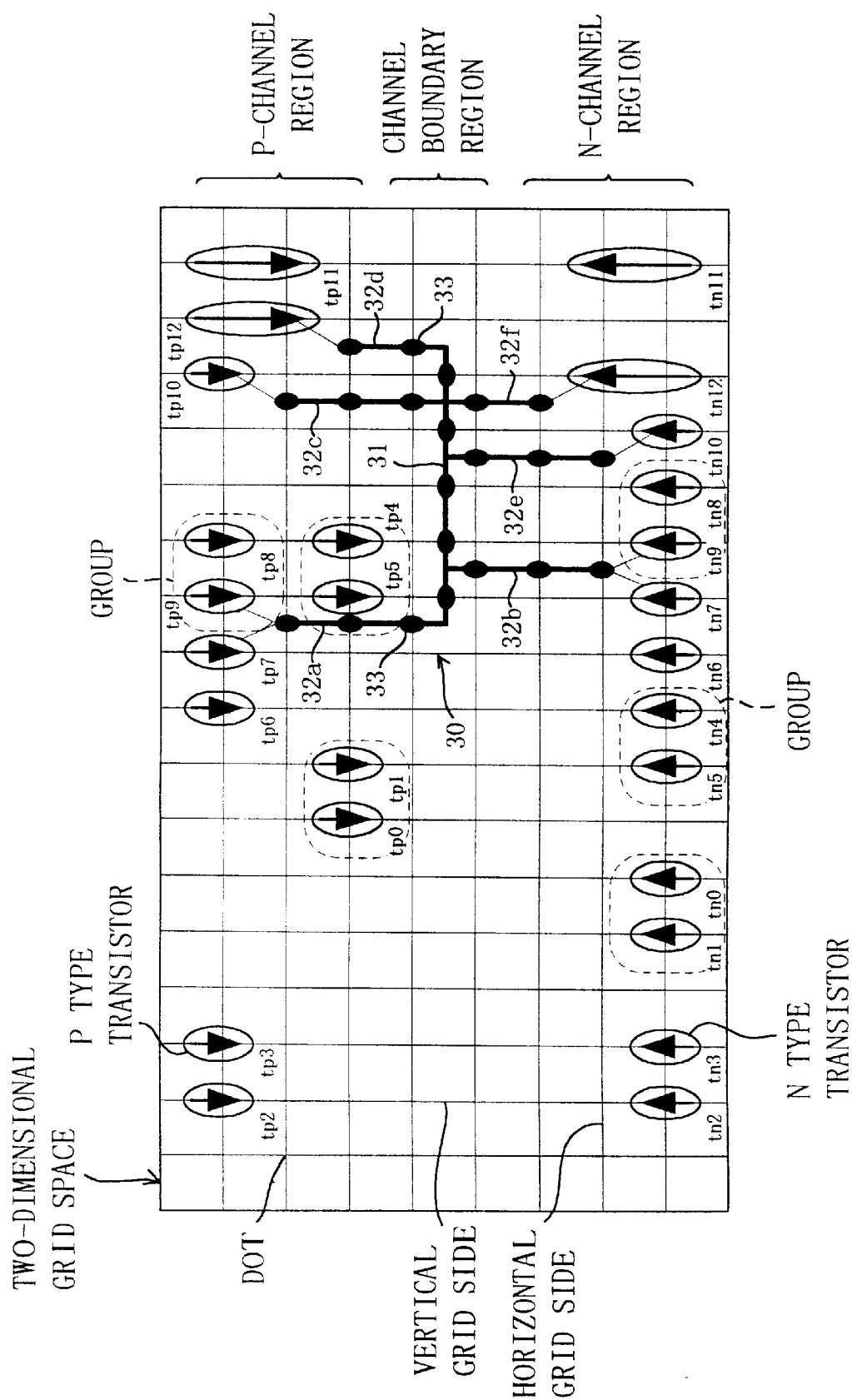
FIG. 9 is a diagram showing two-dimensional placement of transistors in process of executing a processing of optimizing the two-dimensional placement of transistors.

The placement is evaluated as follows. FIG. 9 is a diagram showing the two-dimensional placement of the transistors in a process of executing Step ST16 in which the two-dimensional placement of the transistors is optimized. By using the result of mapping shown in FIG. 8 as initial placement, the placement is changed. First of all, a wiring path is assumed on a grid space obtained after changing the placement. More specifically, a horizontal wiring (trunk) is drawn in a channel boundary region for each net (a set of terminals having the same potential), and a vertical wiring is drawn from each terminal of the net toward the trunk. As shown in FIG. 9, for example, a trunk 31 is drawn in the channel boundary region, a vertical wiring 32a is drawn from diffusion electrodes of transistors tp7 and tp9 toward the trunk 31, a vertical wiring 32b is drawn from diffusion electrodes of transistors tn7 and tn9 toward the trunk 31, a vertical wiring 32c is drawn from a gate electrode of a transistor tp10 toward the trunk 31, a vertical wiring 32d is drawn from a gate electrode of a transistor tp12 toward the trunk 31, a vertical wiring 32e is drawn from a gate electrode of a transistor tn10 toward the trunk 31, and a vertical wiring 32f is drawn from a gate electrode of a transistor tn12 toward the trunk 31 in a net comprising the diffusion electrodes of the transistors tp7, tp9, tn7 and tn9 and the gate electrodes of the transistors tp10, tp12, tn10 and tn12. Thus, a wiring path 30 is assumed.

Then, a wiring density is registered on a grid side on the wiring path. A wiring density 33 is registered on each grid side on the wiring path 30. The placement of the transistors on the mask (real layout) is calculated on the basis of a positional relationship among the transistors on the two-dimensional grid space and the wiring density registered on each grid side. In FIG. 9, for example, when obtaining a spacing between the transistors tp1 and tp5, a vertical wiring density therebetween, that is, a wiring density registered on a horizontal grid side between the transistors tp1 and tp5 is taken into consideration. A wiring length on the real layout is calculated from the placement of the transistors on the real layout obtained by calculation. The placement is evaluated according to the wiring length. The placement is repeatedly changed such that the wiring length is finally reduced.

FIG. 10 is a diagram showing a result obtained by executing Step ST16 of optimizing the two-dimensional placement of the transistors by using the result of mapping shown in FIG. 8 as the initial placement. It is apparent from FIG. 10 that the transistors are placed in a plurality of strings in a horizontal direction of the cell in each channel region and a part of the transistors are placed horizontally so that a width of the cell is greatly reduced.

Figure 11A:
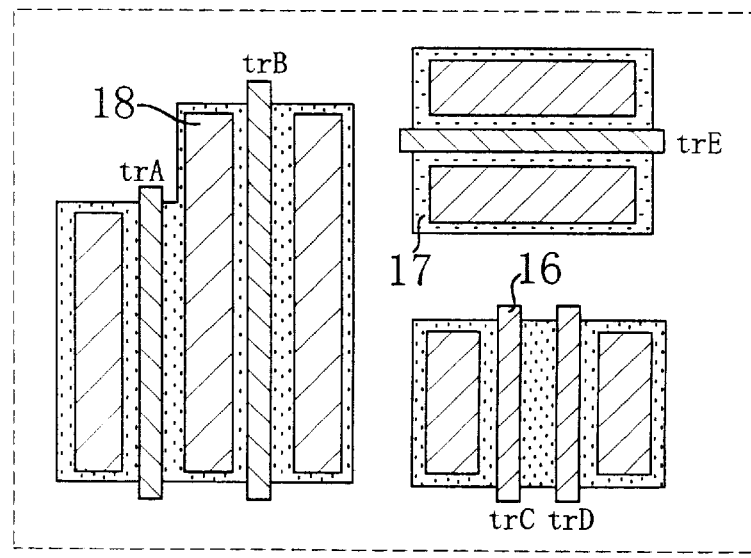
FIG. 11(a) shows an example of a mask pattern and FIG. 11(b) is a diagram showing placement on a two-dimensional grid space corresponding to the mask pattern in FIG. 11(a)
Figure 11B:
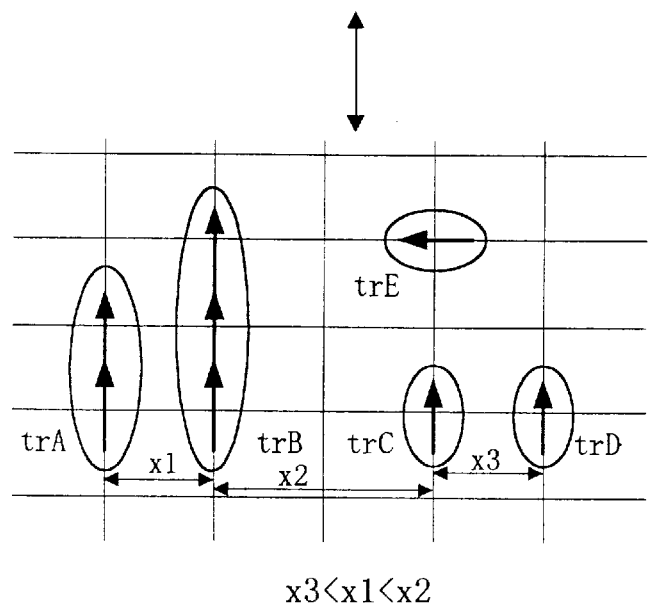

FIG. 11 shows a relationship between a mask pattern and placement on a two-dimensional grid space, FIG. 11(a) showing a mask pattern including transistors trA to trE and FIG. 11(b) showing the placement on the two-dimensional grid space corresponding to the mask pattern in FIG. 11(a). In FIG. 11(a), 16 denotes a gate of a transistor, 17 denotes a diffusion region of the transistor, and 18 denotes a diffusion contact. In the adjacent transistors which share the diffusion, a distance between the dots is varied (x3<x1) depending on whether a contact 18 is interposed between the transistors.

In the case where a size of the transistor is smaller than a height of the cell, a great space area is generated in the cell if the result of the one-dimensional placement is exactly realized in a layout. In such a case, it is necessary to realize a flexible placement style shown in FIG. 10. However, if the placement is determined by only the two-dimensional placement on the two-dimensional grid space, it might take a lot of time to perform a processing. In case of the standard cell, a cell design protocol is often set according to the one-dimensional placement of the transistors having a standard size. Therefore, it is supposed that definition of e two-dimensional placement processing as a post processing of the one-dimensional placement is practically optimal including a problem of a processing time. The transistor placement method according to the present invention takes note of such a respect and is characterized in that global optimization is performed by the one-dimensional placement of the transistors and the two-dimensional placement of the transistors is then performed in order to locally improve the result of the placement. A processing of performing the two-dimensional placement of the transistors has been described in detail in Japanese Unexamined Patent Publication No. 7-338725.

The evaluation indexes in the one-dimensional and two-dimensional placement in the transistor placement method according to the present embodiment will be described below.

If a cell has a middle scale or more which includes 30 or more transistors in the standard cell library, a rate at which the wiring occupies the cell is increased. Therefore, it is supposed that optimization to take note of a wiring length is more effective than optimization to maximize diffusion sharing in order to place the transistors in the cell.

The one-dimensional placement and two-dimensional placement of the transistor placement method according to the present embodiment are optimized by using evaluation indexes based on an estimated value of the wiring length of the cell in order to minimize the wiring length. Consequently, it is possible to closely keep connection between optimization processings of the one-dimensional placement and the two-dimensional placement.

In the real layout of the cell, the gate electrodes of the transistors require connection by a polysilicon layer, and the diffusion electrodes thereof require connection by a first metal layer. The diffusion sharing between the transistors means connection by a diffusion layer. A distance is varied depending on whether a diffusion contact is interposed between the transistors. For the placement of the transistors in the cell, furthermore, it is required that the gates having the same potential should be placed properly between channels with respect to horizontal coordinates as much as possible. Such a condition is not required in the case where minimization of the wiring length is taken into consideration in placement which treats a standard cell as a placement element.

According to the present embodiment, the following is performed in order to cope with the above-mentioned problem. More specifically, a wiring of each net is divided into a plurality of components. A wiring length is estimated for each component. A weighted value is added to an estimated value of the wiring length of each component. By using a sum as an evaluation index, the placement of the transistors is determined.

Figure 12:
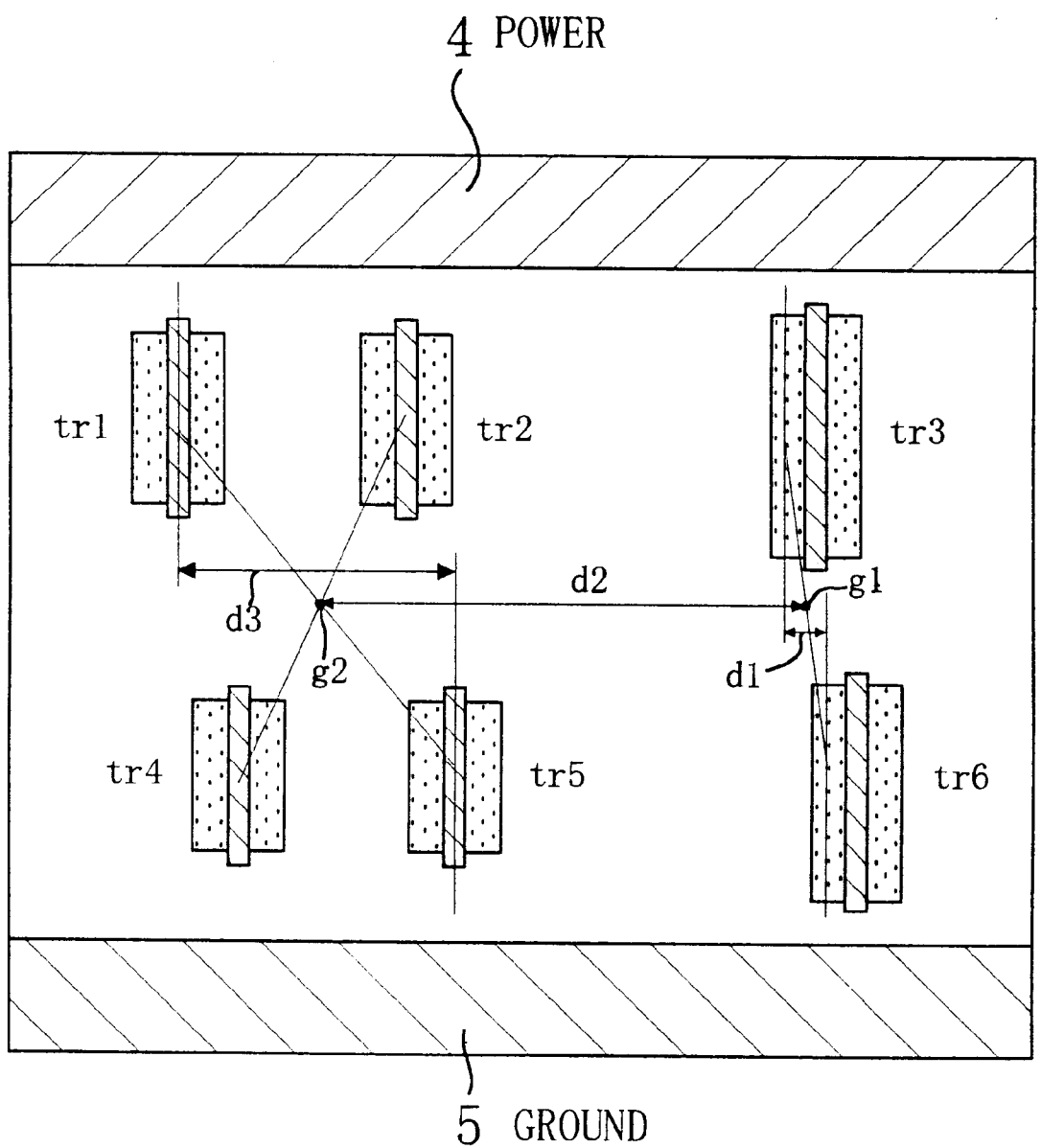
FIG. 12 is a diagram showing a typical example of a wiring structure to explain evaluation of a wiring length according to the present invention.

FIG. 12 is a diagram showing an example of a typical example of a wiring structure. In a MOS logic, it is generally considered that the wiring among the transistors connects a diffusion electrode group to a gate electrode group. Therefore, the wiring is divided into three components, that is, a first component for connecting the diffusion electrodes, a second component for connecting the diffusion electrode group to the gate electrode group, and a third component for connecting the gate electrodes. Thus, a wiring length for each component is estimated. For example, in a wiring for connecting the diffusion electrode group of transistors tr3 and tr6 to the gate electrode group of transistors tr1, tr2, tr4 and tr5 shown in FIG. 12, a wiring length of the first component for connecting the diffusion electrodes is estimated by a distance d1 between the diffusion electrodes of the transistors tr3 and tr6, a wiring length of the second component for connecting the diffusion electrode group to the gate electrode group is estimated by a distance d2 between a center of gravity g1 of the diffusion electrodes of the transistors tr3 and tr6 and a center of gravity g2 of the gate electrodes of the transistors tr1, tr2, tr4 and tr5, and a wiring length of the third component for connecting the gate electrodes is estimated by a distance d3 between the gate electrodes of the transistors tr1 and tr5.

It is assumed that a first metal layer is allocated to the first component for connecting the diffusion electrodes and the second component for connecting the diffusion electrode group to the gate electrode group, and a polysilicon layer is allocated to the third component for connecting the gate electrodes. For example, in order to further reduce a polysilicon wiring having a greater resistance than in a metal wiring, the estimated value d3 of the third component is weighted more than the estimated values d1 and d2 of the first and second components, and a value obtained by summing them can be used as an evaluation index of the placement of the transistors. Thus, a wiring shape can be controlled finely by adjusting the weighting of the estimated value of each component. Consequently, the present invention can also be applied easily to alignment of gates and the like.

SECOND EMBODIMENT

Figure 13:
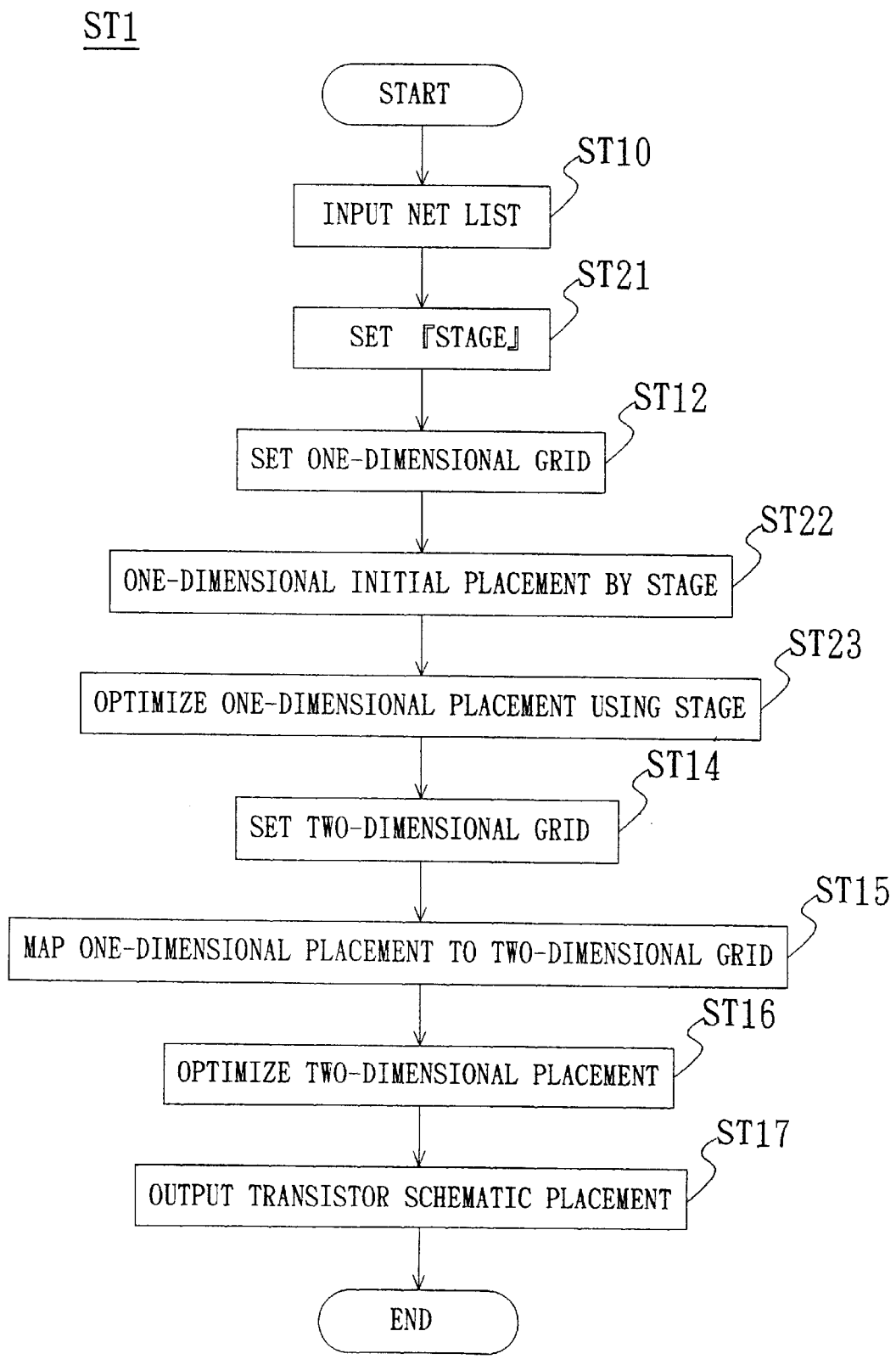
FIG. 13 is a flowchart showing a flow of a processing of a transistor placement method according to a second embodiment of the present invention.

FIG. 13 is a flowchart showing a flow of a processing of a transistor placement method according to a second embodiment of the present invention. The transistor placement method according to the present embodiment has the same basic processing flow as in the first embodiment, and is furthermore characterized in that information on a circuit is utilized when performing one-dimensional placement of transistors.

The transistor placement method according to the present embodiment uses a circuit concept of "stage" when performing the one-dimensional placement of the transistors. In a MOS logic, it can generally be considered that a signal is sent from a drain of a transistor to a gate of another transistor. Therefore, a signal path from each transistor to an output terminal connected with the transistor can be specified from a net list. A path length from the transistor to the output terminal can be represented by the number of gates on the same signal path.

Figure 14:
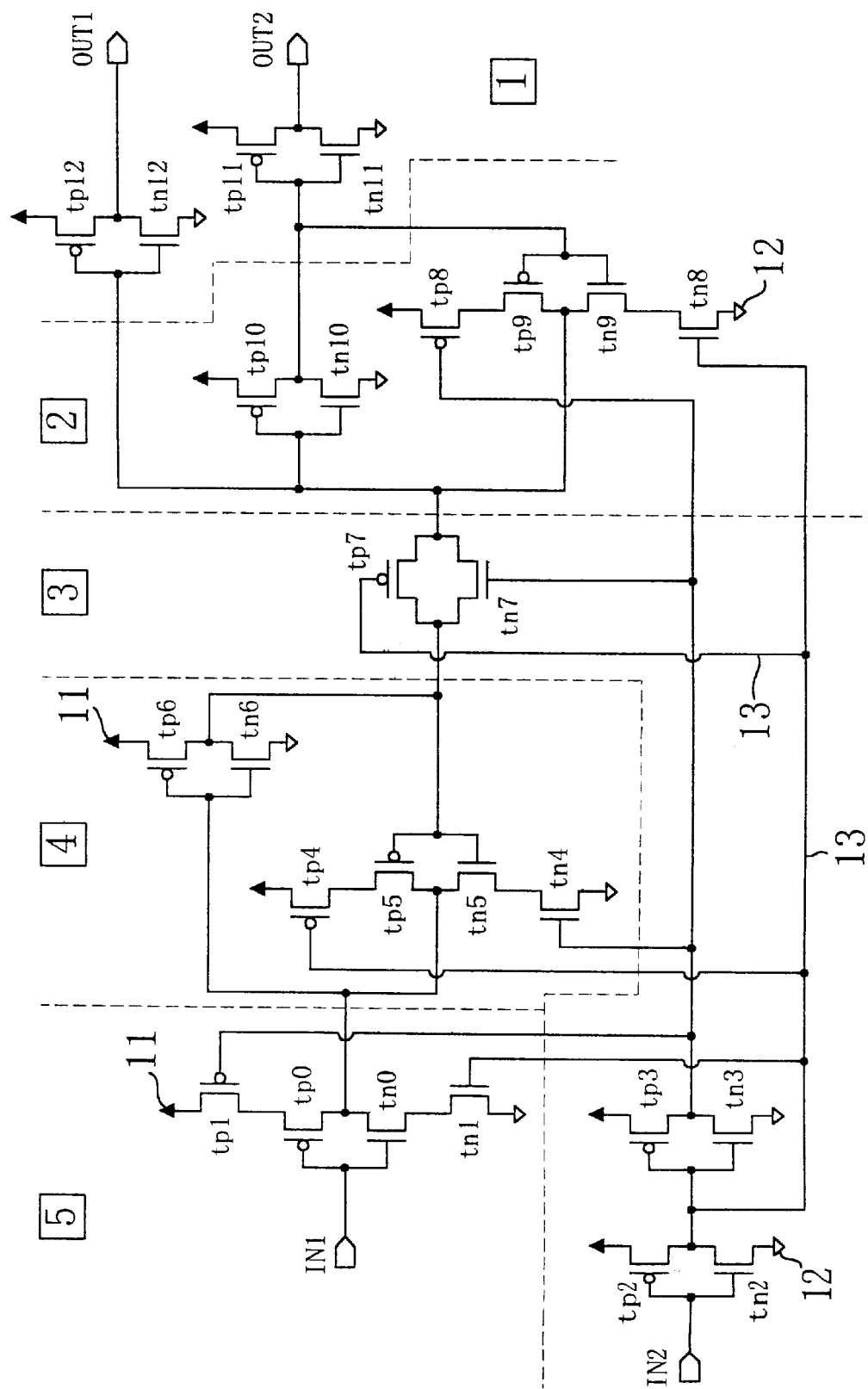
FIG. 14 is a diagram for explaining a concept of a stage and showing the stage in the circuit of FIG. 4.

The number of the gates on the path from the transistor to the output terminal is defined as a stage. FIG. 14 is a diagram showing a stage in the circuit in FIG. 4, in which a numeral enclosed by a square indicates a value of the stage of each transistor. In FIG. 14, the stage of each transistor is as follows.

Stage=1: tp11, tp12, tn11, tn12
Stage=2: tp8, tp9, tp10, tn8, tn9, tn10
Stage=3: tp2, tp3, tp7, tn2, tn3, tn7
Stage=4: tp4, tp5, tp6, tn4, tn5, tn6
Stage=5: tp0, tp1, tn0, tn1

In the transistor placement method according to the present embodiment, a stage is set as shown in FIG. 14 at Step ST21 for a circuit represented by a net list input at Step ST10. At Step ST12, a one-dimensional grid space is set. Then, one-dimensional initial placement based on the stage is performed at Step ST22 and the one-dimensional placement is optimized by using the stage at Step ST23.

Since the stage represents a distance from the transistor to the output terminal, it is a useful concept to optimize a wiring length. It is assumed that input terminals of a cell are placed on the left side and output terminals thereof are placed on the right side. If transistors having stages whose values are greater are placed toward the left and transistors having stages whose values are smaller are placed toward the right, the transistors are placed along a flow of a signal. As a result, a wiring can be optimized. However, a lot of transistors having the same stage are actually present. For this reason, even if the transistors are grouped for each stage and are placed in order, the wiring cannot be optimized.

In the present embodiment, the one-dimensional placement is performed in the following manner. At Step ST22, the one-dimensional initial placement is performed. As described above, in the one-dimensional initial placement at Step ST22, the transistors are placed in order of the stages set at Step ST21. At Step ST23, the one-dimensional placement is optimized. At this time, the stage concept is used as follows. By taking, as an example, the case where the input terminals of the cell are placed on the left side of the cell and the output terminals of the cell are placed on the right side of the cell, a position of a leftmost transistor having a stage value greater, by 1, than a stage value of a transistor optionally selected in successive improvement of the placement is set to a left limit for movement, and a position of a rightmost transistor having a stage value smaller, by 1, than the stage value of the optionally selected transistor is set to a right limit for movement. Thus, the stage concept is effectively used to perform an optimization processing. Consequently, an efficiency of a one-dimensional placement processing can be increased.

Also in the present embodiment, the transistors may be grouped for the circuit represented by the input net list in the same manner as in the first embodiment.

THIRD EMBODIMENT

Figure 15:
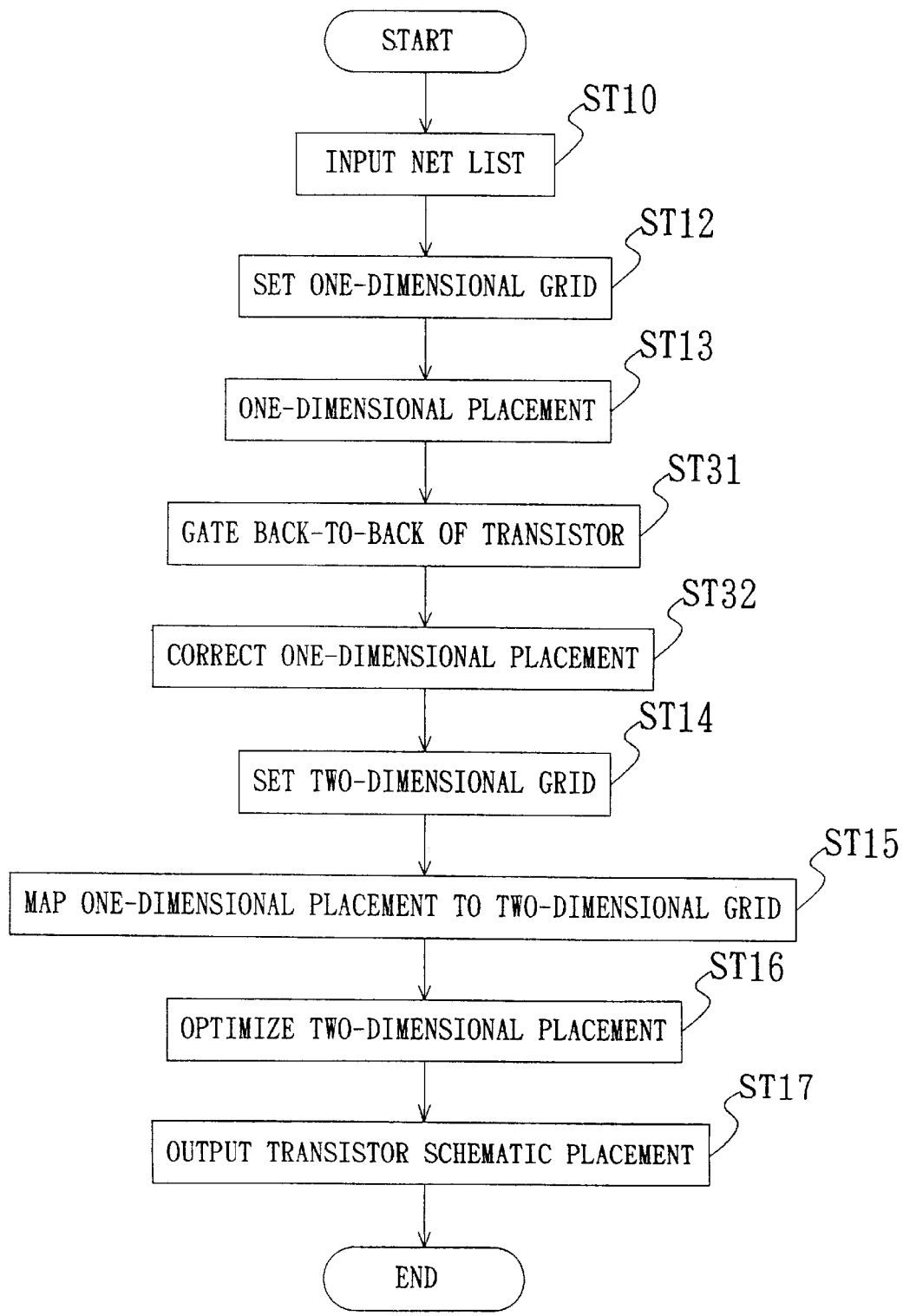
FIG. 15 is a flowchart showing a flow of a processing of a transistor placement method according to a third embodiment of the present invention.

FIG. 15 is a flowchart showing a flow of a processing of a transistor placement method according to a third embodiment of the present invention. The transistor placement method according to the present embodiment is characterized in that a transistor folding step comprising Steps ST31 and ST32 is added between a one-dimensional placement step and a two-dimensional placement step in the transistor placement method according to the first embodiment.

In the case where a transistor having a size greater than a cell height is treated, the transistor folding step is required. In the present embodiment, the transistor folding step is incorporated between the one-dimensional placement step and the two-dimensional placement step so that a gate folding processing of the transistor can be realized with higher precision than in the prior art. While the gate folding processing of the transistor according to the prior art is performed on the basis of only a comparison between the cell height and the transistor size, the gate folding processing of the transistor is performed after the one-dimensional placement is performed in the present embodiment. Consequently, it is also possible to take a wiring density related to the transistor into consideration in accordance with a real layout. More specifically, a wiring density of a horizontal wiring component is obtained for each horizontal placement position of the transistors in the cell from a result of the transistor placement obtained at the one-dimensional placement step. When a layout height obtained by summing a transistor height in one of the transistor placement positions and the wiring density of the horizontal wiring component exceeds a set value of the cell height, the transistors placed in the transistor placement positions are divided by the gate folding processing. The divided transistors are used as new placement elements to correct the result of the transistor placement obtained at the one-dimensional placement step. Since the wiring density in the result of the one-dimensional placement is taken into consideration in the gate folding processing of the transistor, the optimal number of folding steps can be determined according to the wiring density.

Figure 16A:
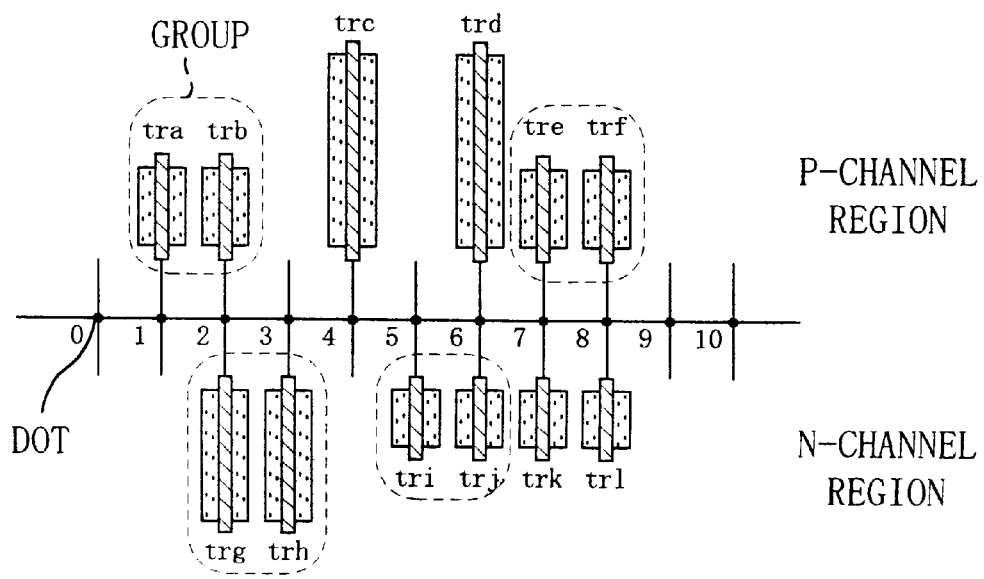
FIG. 16 explains a gate folding processing of a transistor according to the third embodiment of the present invention, FIG. 16(a) showing one-dimensional placement of transistors obtained before the gate folding processing and FIG. 16(b) showing a result obtained by executing the gate folding processing for the one-dimensional placement of transistors in FIG. 16(a)
Figure 16B:
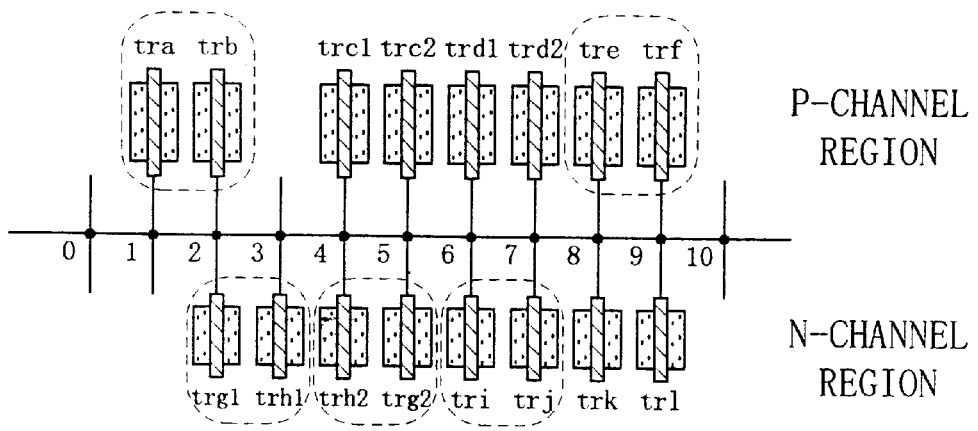

FIG. 16 explains the transistor folding step according to the present embodiment, FIG. 16(a) showing a one-dimensional placement of transistors before the transistor folding step, and FIG. 16(b) showing a result obtained by executing the transistor folding step comprising Steps ST31 and ST32 for the one-dimensional placement of the transistors in FIG. 16(a). It is apparent from FIGS. 16(a) and 16(b) that transistors trc, trd, trg and trh are looped back respectively so that the whole one-dimensional placement of the transistors is also corrected. At Step ST31, the gate folding processing of the transistors is performed. At Step ST32, the one-dimensional placement of the transistors is corrected. Then, the two-dimensional placement step is executed in the same manner as in the first embodiment. Consequently, the transistor placement can be optimized.

FOURTH EMBODIMENT

A fourth embodiment of the present invention relates to a transistor placement method using a one-dimensional placement style in which diffusion and a wiring are optimized together on the basis of placement evaluation on a mask diagram to obtain an optimal placement result.

Figure 17:
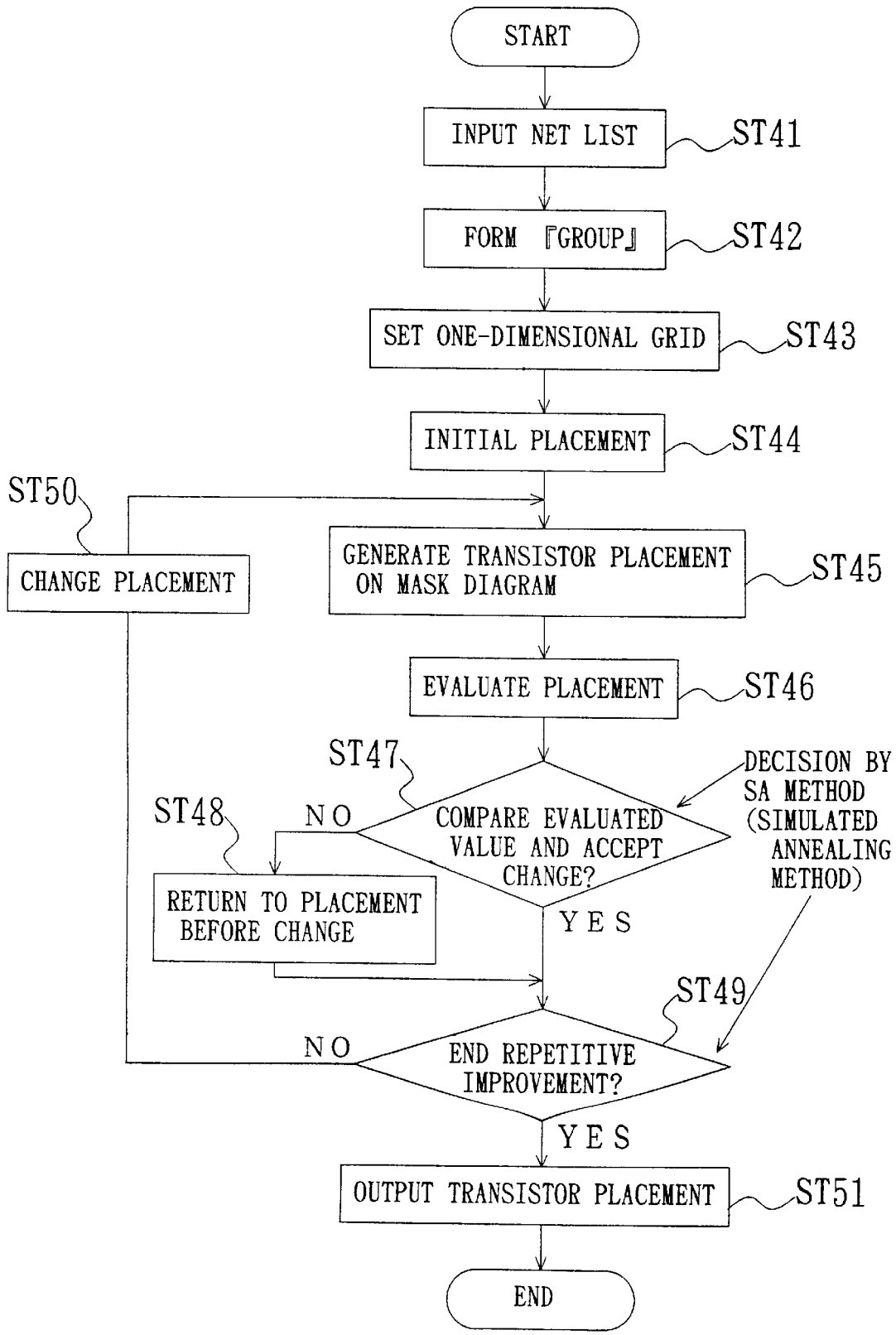
FIG. 17 is a flowchart showing a flow of a processing of a transistor placement method according to a fourth embodiment of the present invention.

FIG. 17 is a flowchart showing a flow of a processing of a transistor placement method according to the fourth embodiment of the present invention. At Step ST41, a net list is input. More specifically, the net list is read from a memory of a computer or the like, and information on a request for connection of input-output terminals of cells and transistors to be placed and on a size of each transistor which are described in the net list are stored in a system.

At Step ST42, the transistors are grouped. In the same manner as in Step Sll according to the first embodiment, if diffusion electrodes of transistors in each channel region form simple serial connection having no branch, the transistors forming the serial connection are grouped together. The transistors which do not belong to any serial connection are not grouped but are considered to solely form serial connection in a broad sense. Thus, each transistor is regarded as a group formed by a single transistor.

In processings to be performed at and after Step ST43, the groups formed at Step S42 are regarded as placement elements having internal placement determined and group placement is optimized.

Figure 18:
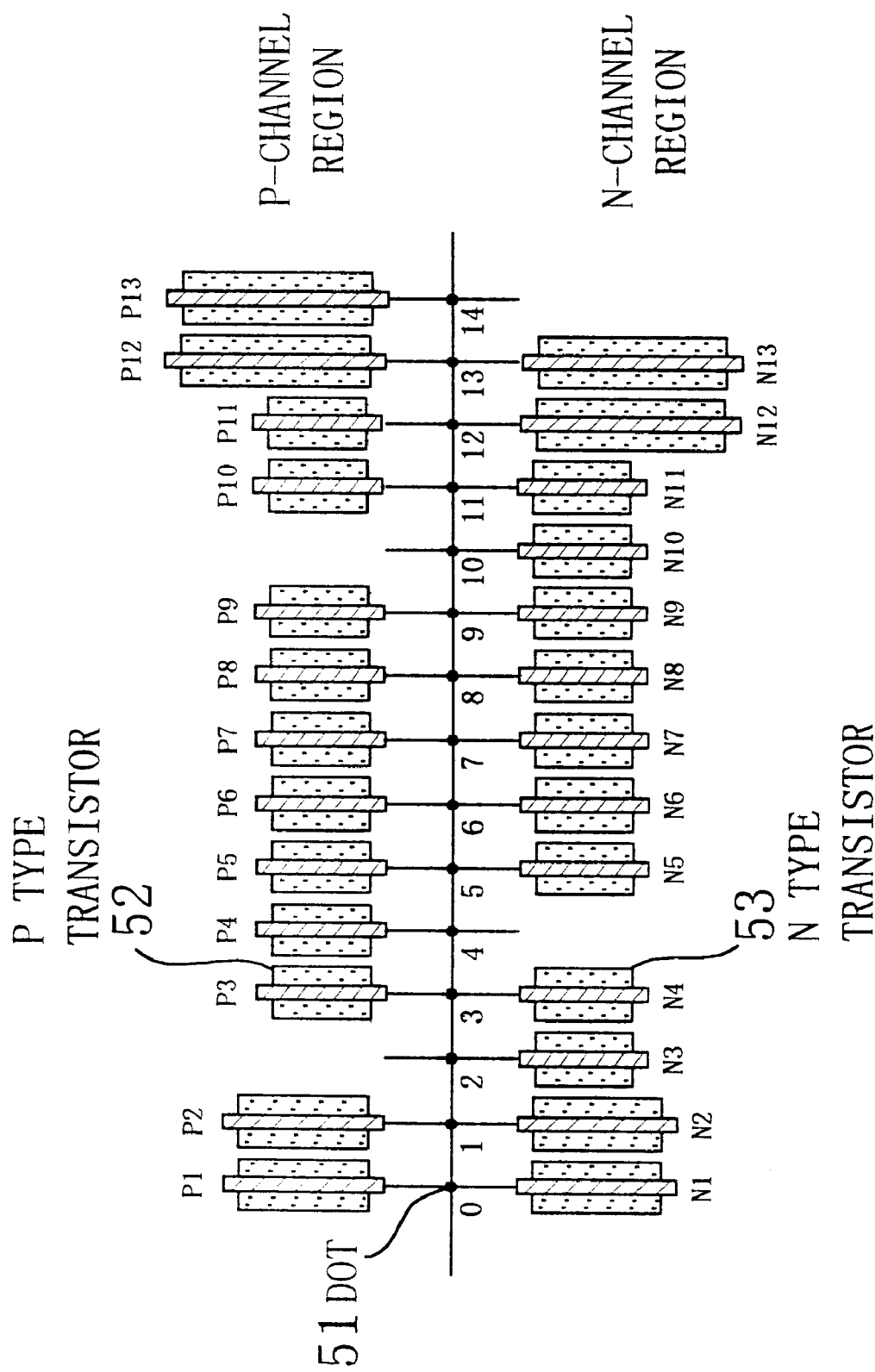
FIG. 18 is a diagram showing an example of transistor e placement on a dot string.

At Step ST43, a one-dimensional grid space, that is, a horizontally placed dot string is set to the cell. At Step ST44, the transistors are initially placed on the dot string set at Step ST43. FIG. 18 shows an example of transistor placement on the dot string. A P type transistor 52 and an N type transistor 53 can be placed vertically on each dot 51. On each dot, either or both of a P-channel region and an N-channel region may be vacant.

The number of dots placed at Step ST43 will be described below. In the case where a problem of the placement is generally handled by using a grid model, the number of the dots to be prepared is usually set to a minimum corresponding to the number of placement elements. The reason is as follows. It has been supposed that a solution space to be searched for optimization becomes greater even if the number of the dots is increased uselessly and an efficiency of a processing is lowered instead. In case of the transistor placement according to the present embodiment, the minimum number of the dots is the greater number of the P type transistors or the N type transistors.

However, when the dot string was used for the problem of the transistor placement to set the number of the dots to a value obtained by adding a margin of about ⅓ to the greater number of the P type transistors or the N type transistors, a result of an experiment that the efficiency of a processing is increased was obtained. It is supposed that such a result was obtained because the number of optimal solutions to give optimal values was also increased with an increase in the number of the dots. There is a possibility that the efficiency of a processing might be lowered if the number of the dots is excessively increased. However, it is effective to add a margin to the number of the transistors to some extent in order to increase the efficiency of a processing.

In processings at and after Steps ST45 to ST50, the group placement is optimized by repetitive processings. In the placement optimization processing according to the present invention, initial placement is repetitively improved to determine placement having a minimum placement evaluation function. While scheduling is realized by a simulated annealing method (SA method) in the present embodiment, other scheduling methods can also be used.

Figure 19A:
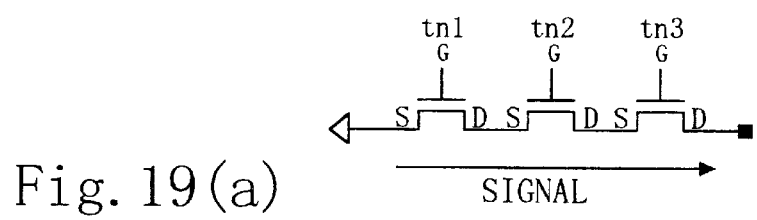
FIG. 19 shows that a group formed by the group forming processing according to the present invention has a degree of inversion freedom, FIG. 19(a) showing transistors belonging to a group and FIG. 19(b) showing two kinds of placement on a dot string of the transistors of the group in FIG. 19(a)
Figure 19B:
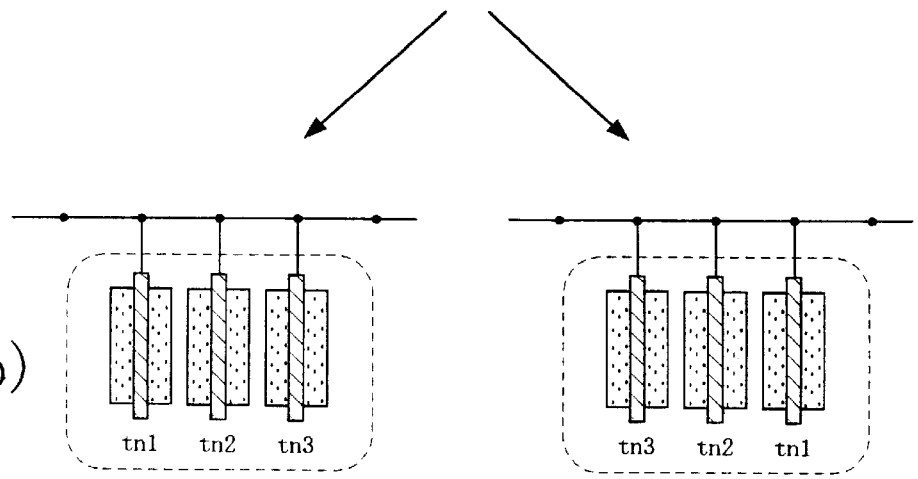

Prior to description of the placement optimization processing, a relationship between the transistor placement and the group placement on the dot string will briefly be described below. As described above, the transistors are placed in the group in serial order on a circuit. On the dot string, this transistor string is allocated to consecutive dots. In this case, two ways of the transistor placement in the group can be obtained on the dot string such that transistors of a group shown in FIG. 19(a) can be placed on the dot string in two ways shown in FIG. 19(b), for example. It can be supposed that the group has a degree of inversion freedom. In the group placement optimization processing, a degree of inversion freedom of each group is also taken into consideration.

At Step ST45, the transistor placement on the dot string is coordinate-transformed into transistor placement on a mask diagram which meets a mask design rule. Since the transistor placement on the mask diagram which reflects the mask design rule should be optimized finally, it is necessary to convert the placement on the dot string into the placement on the mask diagram in order to effectively perform placement evaluation.

FIG. 20 is a chart showing an example of data indicative of the placement on the dot string. In FIG. 20, x denotes a dot, tr name denotes an identification mark of a transistor, L mnet denotes a net number of a diffusion electrode on the left side of the transistor, G mnet denotes a net number of a gate electrode of the transistor, R mnet denotes a net number of a diffusion electrode on the right side of the transistor, and mssc denotes an identification number of a group. The transistors belonging to the same group have the same values. In FIG. 20, the symbol of * represents that the transistor is not placed on the dot.

A method for converting the placement on the dot string into the placement on the mask diagram shown in FIG. 20 is not obvious. It is supposed that a method for independently compacting the transistors in order from the left in respective channel regions is the easiest way to convert the placement on the dot string into the placement on the mask diagram. In other words, the placement position of the transistor on the mask diagram is determined on the basis of only a relationship with a transistor on just the left in the same channel region. FIG. 21 shows the placement on the mask diagram obtained by converting the placement on the dot string shown in FIG. 20 by the above-mentioned converting method. In FIG. 21, a clearance 81 indicates that diffusion islands are separated from each other because opposite diffusion electrodes have different potentials. A clearance 82 indicates that a diffusion contact is provided therein because opposite diffusion electrodes have the same potential and other electrodes also have the same potential, and that diffusion islands are connected. A section 83 having no clearance between the transistors indicates serial connection of diffusion having no branch. Consequently, it is apparent that the transistors are placed as a group. Thus, a structure of the diffusion islands in each channel region can also be represented accurately by a simple left compaction converting method. However, a variety of placement on the dot string cannot be obtained, for example, a spacing between the diffusion islands is always equal to a minimum rule. For this reason, this method is not suitable for conversion for placement evaluation.

As another simple converting method, a P type transistor and an N type transistor provided on the same dot are placed on the mask diagram with centers of gates fitted. When the placement of the transistors is determined in one of the channel regions, the placement can be determined on the basis of a relationship with an adjacent transistor in the same channel if a transistor is not placed on the same dot in the other channel region. While this method has conventionally been used very often, it has a drawback that diffusion islands cannot be represented accurately in the case where a mask design rule related to diffusion is complicated. For example, there is actually a rule in which a spacing between gates of adjacent transistors sharing a diffusion electrode is varied depending on whether the shared diffusion electrode needs a diffusion contact. According to this method in which the gates are always arranged properly, the diffusion islands adapted to the above-mentioned rule cannot be represented accurately.

In the present embodiment, the following converting method is used in order to place the transistors with a minimum size according to the mask design rule in the diffusion island and to place the transistors with a spacing reflected by the placement on the dot string between the diffusion islands.

Figure 22:
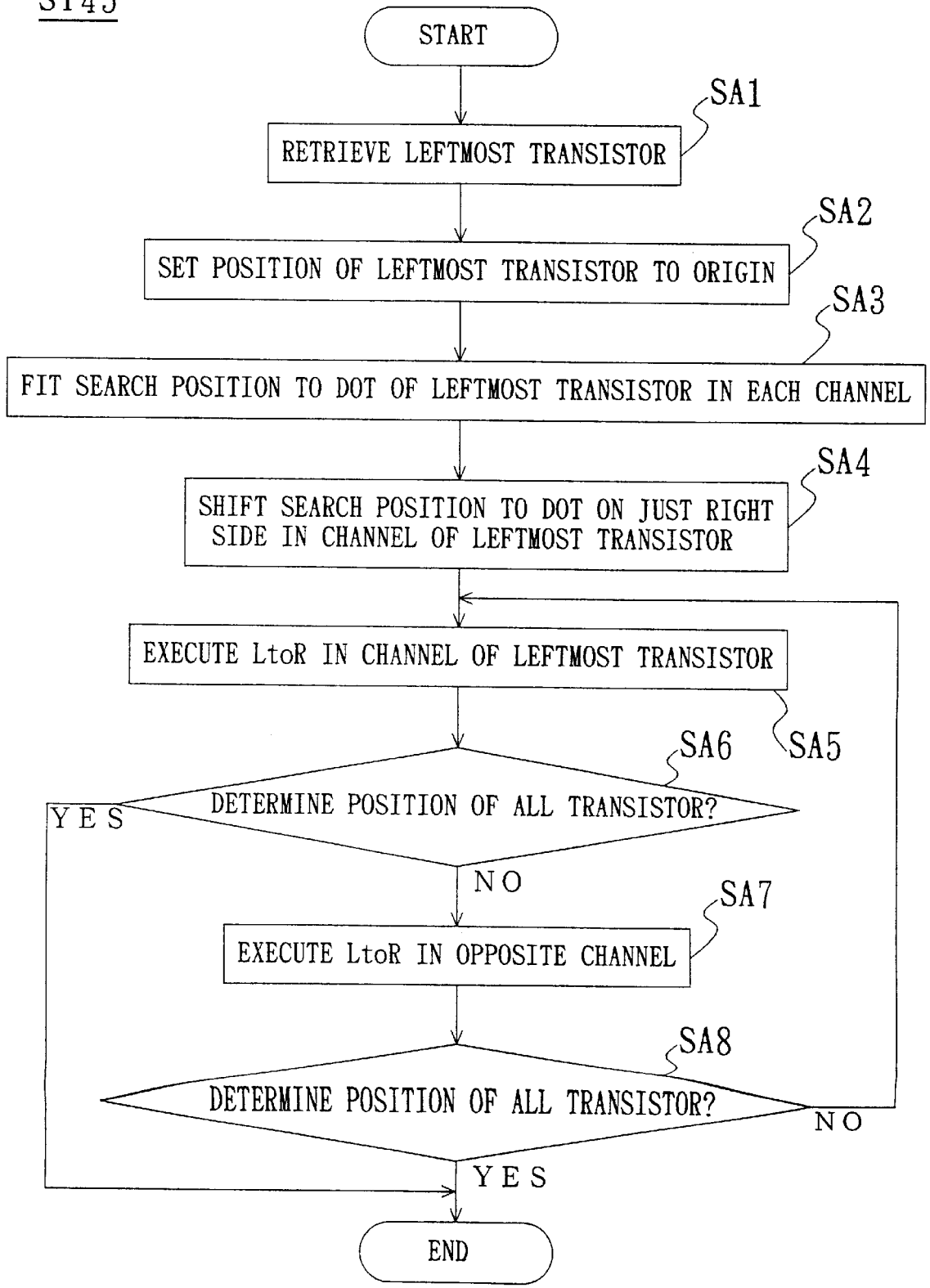
FIG. 22 is a flowchart showing a flow of a basic processing of a method for converting placement on a dot string into placement on a mask diagram according to the present invention.
Figure 23:
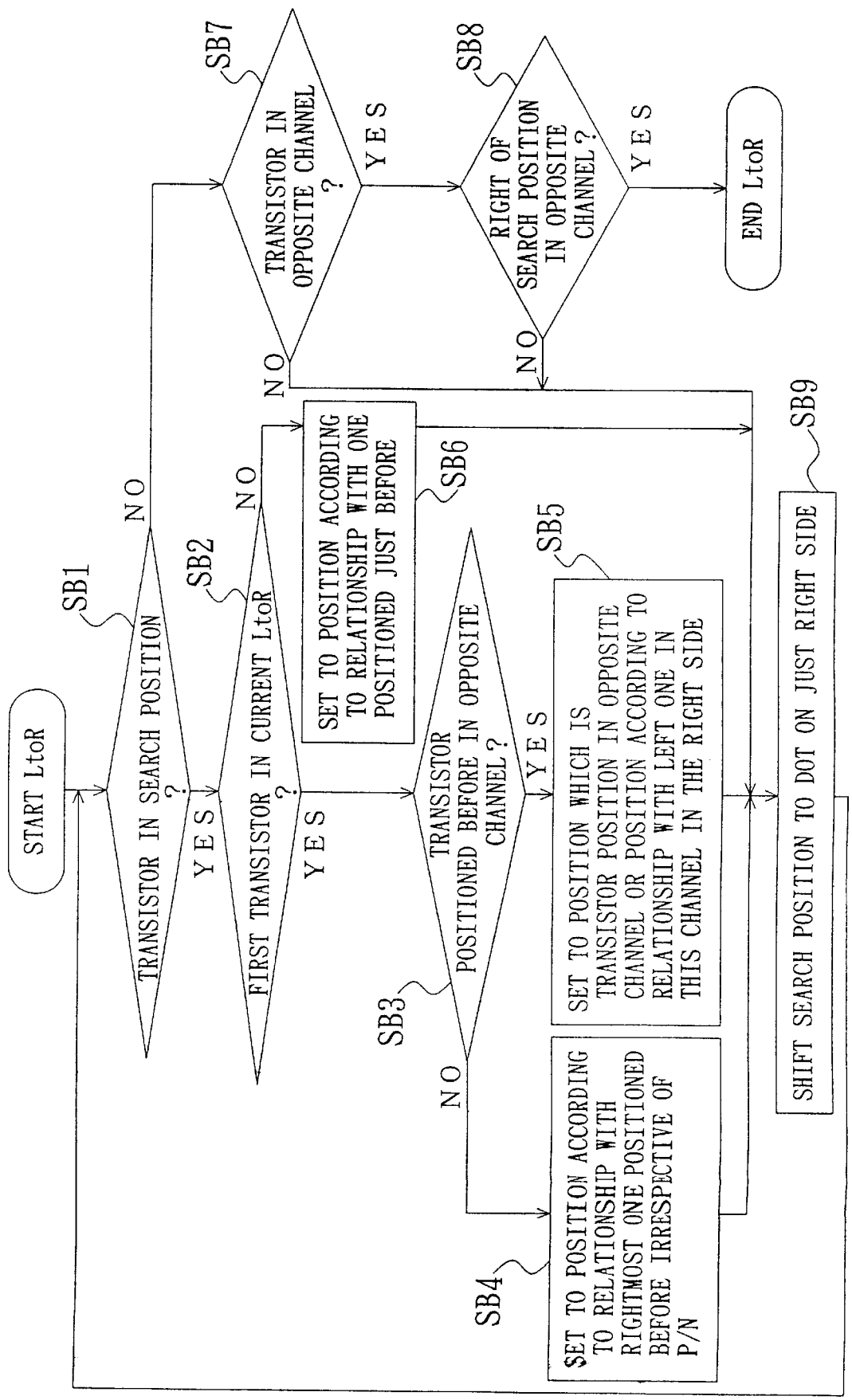
FIG. 23 is a flowchart showing a processing (LtoR) of determining positions of transistors while tracing the transistors from left to right in one of channel regions in the method for converting placement on a dot string into placement on a mask diagram according to the present invention.

FIGS. 22 and 23 are flowcharts showing processings of the method for converting the placement on the dot string into the placement on the mask diagram according to the present embodiment. FIG. 22 shows a basic processing flow, and FIG. 23 shows a processing (LtoR) of determining positions while tracing the transistors from left to right in one of the channel regions. According to this method, the positions of the transistors are basically determined in order from left to right. The processing of determining the positions while tracing the transistors from left to right in one of the channel regions is suspended in relation to a status of the transistor placement in the other channel region, and the same processing is then performed in the other channel region. This procedure is repeated. It is apparent that the positions of the transistors may be determined from right to left.

By taking, as an example, the case where the placement on the dot string is converted into the placement on the mask diagram as shown in FIG. 18, the method for converting the placement on the dot string into the placement on the mask diagram according to the present embodiment will be described below with reference to the flowcharts in FIGS. 22 and 23. At Step SA1, a P type transistor P1 is specified as a leftmost transistor. At Step SA2, a position of the P type transistor P1 is set to an origin on the mask diagram. At Step SA3, a search position is set to a grid position of the leftmost transistor in each channel region. In other words, the search position is set to a dot 0 in a P-channel region and an N-channel region. At Step SA4, the search position is moved to a dot on just the right side in the channel region of the leftmost transistor (P type transistor P1), that is, the P-channel region. Consequently, the search position of the P-channel region is a dot 1.

At Step SA5, a LtoR processing is executed in the channel region of the leftmost transistor (P type transistor P1), that is, the P-channel region (FIG. 23). At Step SB1, it is decided whether or not the transistor is provided in the search position. Since a P type transistor P2 is provided on the dot 1, the routine proceeds to Step SB2. At Step SB2, the P type transistor P2 is a first transistor in the LtoR processing. Consequently, the routine proceeds to Step SB3. At Step SS3, an N type transistor whose position has been determined is not provided on the dot 1 (a position of an N type transistor N2 on the mask diagram has not been determined yet). Consequently, the routine proceeds to Step SB4 where the position of the P type transistor P2 on the mask diagram is determined irrespective of a type on the basis of a relationship with the rightmost transistor whose position has been determined. In other words, the position of the P type transistor P2 on the mask diagram is determined on the basis of the P type transistor P1 whose position has been determined.

At Step SB9, the search position is moved to a dot on just the right side, that is, a dot 2. Then, the routine returns to Step SB1. Since the P type transistor is not provided on the dot 2, the routine proceeds to Step SB7. At Step SB7, an N type transistor N3 is provided on the dot 2. Consequently, the routine proceeds to Step SB8. At Step SB8, since the dot 2 which is the search position of the P-channel region is provided on the right of the dot 0 which is the search position of the N-channel region, the LtoR processing is ended.

At Step SA6, positions of all the transistors have not been determined yet. Consequently, the routine proceeds to Step SA7. The LtoR processing is executed by using the dot 0 as the search position in the N-channel region to which the leftmost transistor (P type transistor P1) does not belong. The N type transistor N1 is provided on the dot 0 (Step SB1), and the N type transistor N1 is the first transistor of the LtoR processing (Step SB2). Consequently, the routine proceeds to Step SB3. At Step SB3, the P type transistor P1 whose position has been determined is provided on the dot 0. Consequently, the routine proceeds to Step SB5 where the N type transistor N1 is set to the position of the P type transistor P1 (because a transistor is not provided on just the left of the N type transistor N1). Then, the routine proceeds to Step SB9.

At Step SB9, the search position is moved to a dot on just the right side, that is, the dot 1. Then, the routine returns to Step SB1. The N type transistor N2 is provided on the dot 1 (Step SB1), and the N type transistor N2 is not the first transistor in the LtoR processing (Step SB2). Consequently, the routine proceeds to Step SB6. At Step SB6, a position of the N type transistor N2 is determined on the basis of the position of the transistor whose position has been determined just before, that is, the position of the N type transistor N1. In the same manner, a position of ah N type transistor N3 is determined on the basis of the position of the N type transistor N2, and a position of an N type transistor N4 is determined on the basis of the position of the N type transistor N3.

At Step SB9, the search position is moved to a dot 4. Then, the routine returns to Step SB1. Since an N type transistor is not provided on the dot 4, the routine proceeds to Step SB7. At Step SB7, a P type transistor P4 is provided on the dot 4. Consequently, the routine proceeds to Step SB8. At Step SB8, the LtoR processing is ended because the dot 4 which is the search position of the N-channel region is provided on the right of the dot 2 which is the search position of the P-channel region.

At Step SA8, the positions of all the transistors have not determined yet. Consequently, the routine returns to Step SA5 where the LtoR processing is executed by using the dot 2 as the search position in the P-channel region. On the dot 2, a P-type transistor is not provided (Step SB1) but an N type transistor is provided (Step SB7). Consequently, the routine proceeds to Step SB8. At Step SB8, the dot 2 which is the search position of the P-channel region is not provided on the right of the dot 4 which is the search position of the N-channel region. Consequently, the routine proceeds to Step SB9 where the search position is moved to a dot on just the right side, that is, the dot 3. Then, the routine returns to Step SB1. Since the P type transistor P3 is provided on the dot 3 (Step SB1) and is the first transistor in the LtoR processing (Step SB2), the routine proceeds to Step SB3. Since the N type transistor N4 whose position has been determined is provided on the dot 3 (Step SB3), the position of the N type transistor N4 is compared with a position determined on the basis of a relationship between the P type transistor P3 and the P type transistor P2 so that the position of the P type transistor P3 is determined on the right side at Step SB5.

At Step SB9, the search position is moved to a dot on just the right side, that is, the dot 4. Then, the routine returns to Step SB1. Since the P type transistor P4 is provided on the dot 4 (Step SB1) and is not the first transistor in the LtoR processing (Step SB2), the routine proceeds to Step SB6. At Step SB6, a position of the P type transistor P4 is determined on the basis of the transistor whose position has been determined just before, that is, the position of the P type transistor P3. In the same manner, positions of P type transistors P5 to P9 are determined.

At Step SA6, the positions of all the transistors have not been determined yet. Consequently, the routine proceeds to Step SA7 where the LtoR processing is executed by using the dot 4 as the search position in the N-channel region. In the LtoR processing, a position of an N type transistor N5 is determined on the basis of the position of the P type transistor P5 and a position determined according to a relationship between the N type transistor N4 and the N type transistor N5. Positions of N type transistors N6 to N13 are determined on the basis of positions of N type transistors provided on just the left side, respectively. In the LtoR processing to be executed by using a dot 10 as the search position in the P-channel region, similarly, a position of a P type transistor P10 is determined on the basis of the position of the N type transistor N11 and a position determined according to a relationship between the P type transistor P9 and the P type transistor P10. Positions of P type transistors P11 to P13 are determined on the basis of positions of P type transistors provided on just the left side, respectively.

As described above, the method for converting the placement on the dot string into the placement on the mask diagram according to the present embodiment follows a minimum rule related to diffusion while tracing the transistors from left to right in one of the channel regions, and refers to a position of only the first transistor in the opposite channel region when a processing for tracing the transistors from left to right is newly started after movement to the other channel region. In other words, if a transistor is placed in a dot position on just the left of a transistor in the same channel region, a position of one of the transistors on the mask diagram is determined on the basis of the position of the left transistor on the mask diagram. If a transistor is not placed, the position of one of the transistors to be placed on the mask diagram is determined as follows. When a transistor is placed on the same dot position as one of the transistors in a different channel region and a position of the transistor to be placed on the mask diagram has already been determined, the position of one of the transistors to be placed on the mask diagram is determined on the basis of the position of the transistor placed on the mask diagram. Consequently, it is possible to reflect, on the mask diagram, the placement on the dot string comparatively faithfully. Thus, a great effect can be produced on the optimization of the transistor placement on the mask diagram.

Figure 24:
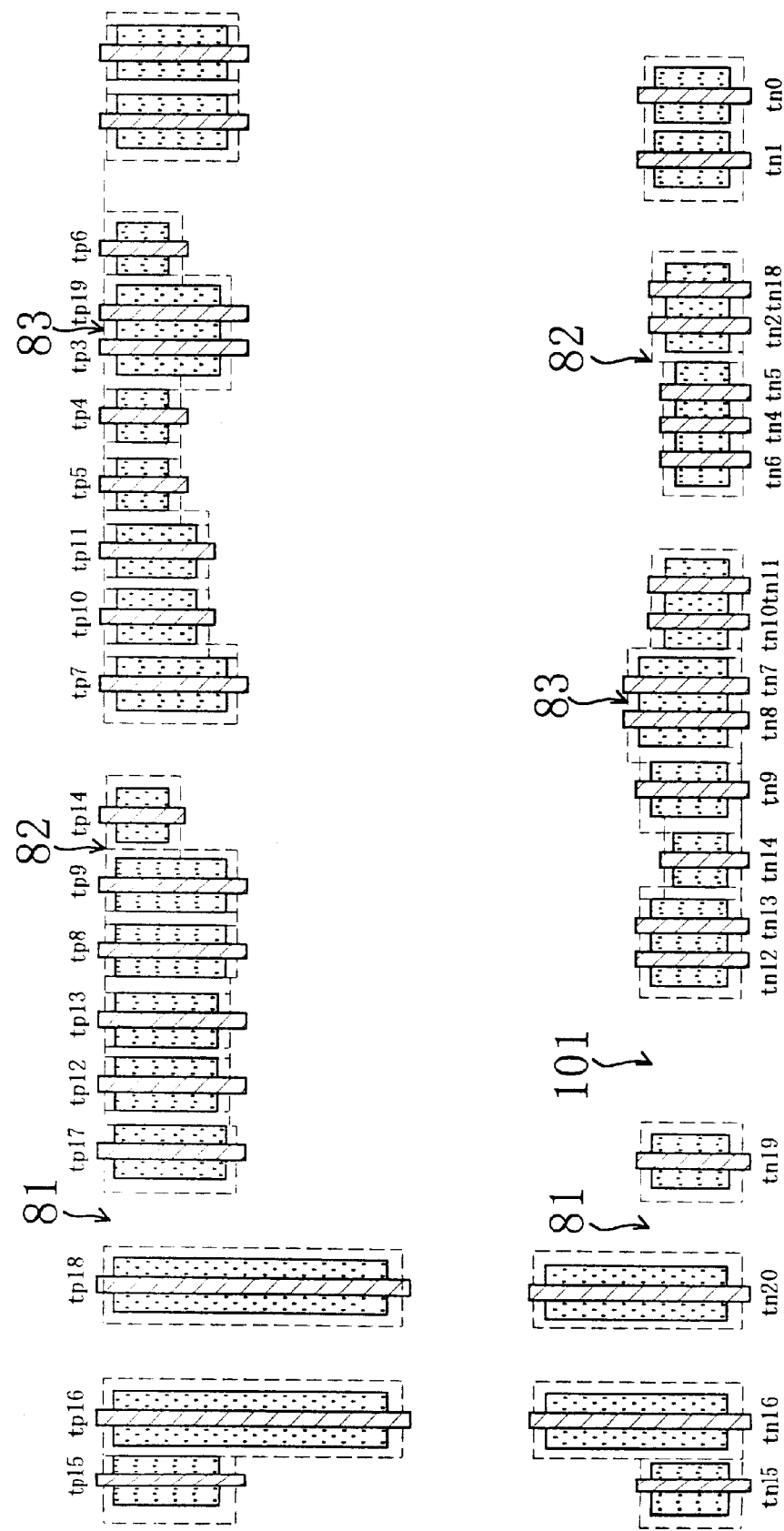
FIG. 24 shows a result obtained by converting the placement on the dot string in FIG. 20 into placement on a mask diagram by the converting method according to the present invention.

FIG. 24 is a diagram showing placement on a mask diagram obtained by converting the placement on the dot string in FIG. 20 by using the above-mentioned converting method. While all the diffusion islands in the N-channel region are put toward the left in FIG. 21, this respect is corrected in FIG. 24. It is apparent that a gap 101 is made, the gap 101 being greater than in the mask design rule.

At Step ST46, the placement on the mask diagram is evaluated. In order to reduce a cell width and a cell height simultaneously to obtain an optimal layout of a cell, it is necessary to achieve optimization of diffusion islands and a wiring at the same time. A placement evaluating method including definition of a placement evaluation function acts as a key to realize the optimization.

A placement evaluation method according to the present embodiment will be described below. Basically, the placement is evaluated on the basis of an extension of a net. The net for evaluation meets the following two conditions.

a signal net (neither a power net nor a ground net)

a net extending over groups.

In the transistor placement method according to the prior art, a net indicative of connection between electrodes of transistors has often been represented again as connection among groups. In that case, a position of the electrode on a real mask diagram is not reflected. Therefore, a wiring shape is not evaluated accurately. According to the present embodiment, a position of a transistor electrode is directly used to evaluate a wiring on the mask diagram.

Figure 25:
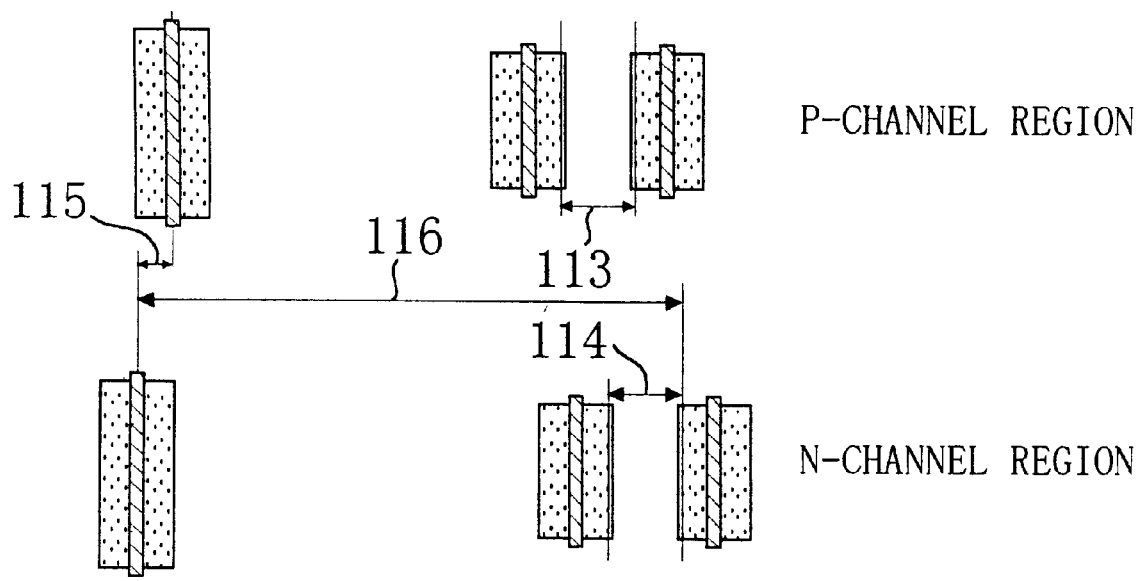
FIG. 25 is a diagram showing a net extension used for placement evaluation according to the present invention.

A net having a transistor level is formed by two kinds of electrodes, that is, a diffusion electrode of a transistor (source or drain) and a gate electrode of the transistor. Transistors are divided into P and N types. The electrodes forming the net are divided into three electrode groups, that is, a P type diffusion electrode group (a diffusion electrode of a P type transistor), an N type diffusion electrode group (a diffusion electrode of an N type transistor), and a gate electrode group. For each net, four extensions will be considered. The four extensions include (a) an extension of the P type diffusion electrode group, (b) an extension of the N type diffusion electrode group, (c) an extension of the gate electrode group, and (d) an extension of a full electrode group. In the present embodiment, the placement of transistors is regarded as a horizontal one-dimensional placement style. Therefore, only a horizontal extension is evaluated for the net. The extension of the P type diffusion electrode group is estimated by a distance between a leftmost P type diffusion electrode and a rightmost P type diffusion electrode in the net. The extension of the N type diffusion electrode group is also estimated in the same manner. Similarly, the extension of the gate electrode group is also estimated by a distance between leftmost and rightmost gate electrodes in the net. The extension of the full electrode group is estimated by a distance between leftmost and rightmost electrodes in the net irrespective of the kind of the electrode. FIG. 25 is a diagram showing extensions of four nets. In FIG. 25, 113 denotes an extension of a P type diffusion electrode group, 114 denotes an extension of an N type diffusion electrode group, 115 denotes an extension of a gate electrode group, and 116 denotes an extension of a full electrode group.

A placement evaluation function S is defined. A value of a net extension used for the placement evaluation function S is calculated from an electrode position based on an estimation of a transistor position described above. The extension of the P type diffusion electrode groups of each net is represented by A, the extension of the N type diffusion electrode groups of each net is represented by B, the extension of the gate electrode groups of each net is represented by C, and the extension of the full electrode groups of each net is represented by D to obtain the following equation.

$$S = \sum_{net} (w1 * A + w2 * B + w3 * C + w4 * D)$$

wherein w1, w2, w3 and w4 represent weighting constants.

If w1=w2=w3=0 and w4=1.0 are set, the weighting constants become equivalent to an evaluation function used for usual evaluation of a wiring length. On the other hand, the weighting constants w1, w2 and w3 are set to positive numbers in the present embodiment. This aim will be described below.

First of all, it is necessary to describe the reason why diffusion can also be optimized by basically evaluating an extension of a wiring. The reason is that the wiring is evaluated by placement on a mask diagram. When diffusion sharing is promoted so that a portion of diffusion separation is reduced, a channel width can be reduced on a mask basis. Accordingly, a cell width is reduced. It can greatly be expected that the sum of the net extensions, that is, a value of D in the placement evaluation function S is reduced if the cell width is reduced. More specifically, it is supposed that minimization of the net extension D and optimization of the diffusion are correlated with each other to some extent as long as the net extensions are evaluated accurately.

If the diffusion electrode should be shared positively, it is sufficient that the net extensions A and B are added to the placement evaluation function. It is supposed that values of the extensions A and B of the diffusion electrodes in a channel should considerably be reduced if two diffusion electrodes can be shared. Only a signal net is a target for evaluation. Therefore, if the extension of the diffusion electrode is reduced to promote to share the diffusion electrodes, a drain capacity is also reduced. For this reason, it is also considered that the drain capacity is reduced by adding the net extensions A and B to the placement evaluation function. Thus, the placement evaluation function S can indirectly optimize the diffusion while directly optimizing the wiring. Finally, a term C of the placement evaluation function S is added such that alignment of gates can be promoted. While grouping is performed on the basis of extraction of a partial circuit and the alignment of the gates is forcibly assured by placement in a group in the prior art, the alignment of the gates can be realized more flexibly while adapting to the placement of the transistors in the whole cell by the grouping and the placement evaluation function according to the present invention.

At Step ST50, the placement is changed. In most cases, conventionally, the transistor placement has been changed on condition that a P type transistor and an N type transistor have some coupling relationship and the coupled transistors should always operate at the same time. In the transistor placement method according to the present embodiment, however, it is intended that the placement of all transistors is optimized by the placement evaluation function without presetting the coupling relationship between the P type transistor and the N type transistor. Therefore, Step ST50 features that only the placement of groups in one of channels is changed each time.

As described above, in the transistor placement method according to the present embodiment, the placement on the mask diagram based on the mask design rule is optimized. The diffusion can also be optimized indirectly while optimizing the wiring. In order to increase an efficiency of a processing, only minimum grouping to collect serial connection having no branch is performed. Therefore, an applicable range of the cell is wide.

Figure 27:
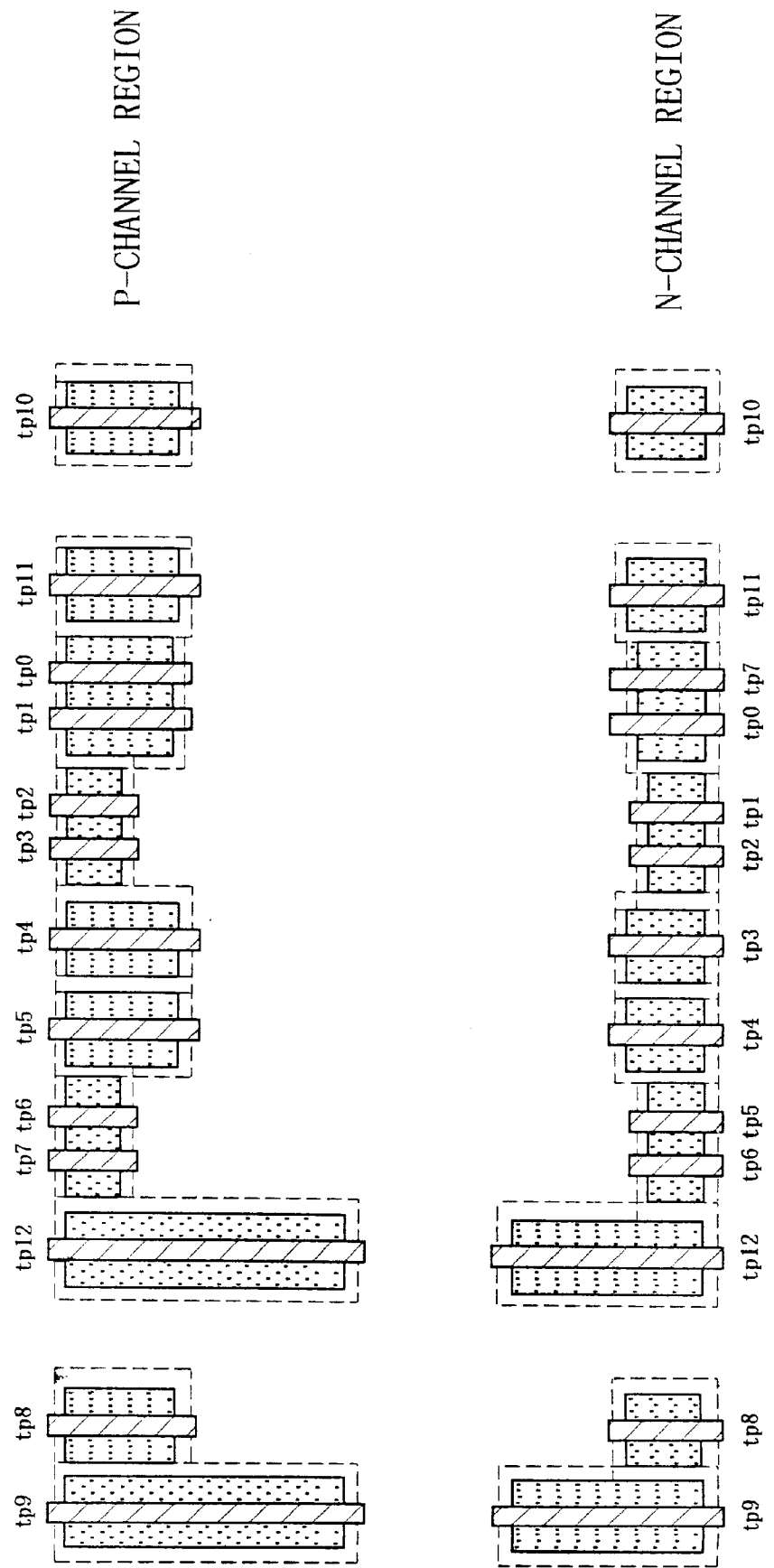
FIG. 27 shows transistor placement on a mask diagram obtained by executing the transistor placement method according to the fourth embodiment of the present invention for the circuit in FIG. 4.

FIGS. 26 and 27 show results obtained by executing the transistor placement method according to the present embodiment for the circuit shown in FIG. 4. FIG. 26 is a chart showing data indicative of placement on a dot string, and FIG. 27 is a diagram showing placement of transistors on a mask diagram. In this case, a processing time taken by a computer is about 5 minutes. Thus, it is apparent that the transistor placement method according to the present embodiment is fully practical.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A transistor placement method for determining placement of transistors in a cell region on the basis of a net list which describes information on connection of the transistors in a cell having at least one transistor and information on a size of each transistor, the cell having a vertical height set to a predetermined value, and a variable horizontal width, comprising:
 a one-dimensional placement step of vertically dividing the cell region into a P-channel region and an N-channel region, placing, on the basis of the net list, P type transistors of the cell in the P-channel region in one string in the horizontal direction of the cell with vertical placement state in which the gate width direction fits the vertical direction of the cell, and N type transistors of the cell in the N-channel region in one string in the horizontal direction of the cell with the vertical placement state; and
 a two-dimensional placement step of changing the placement of the transistors for a result of transistor placement obtained at the one-dimensional placement step so as to reduce a width of the cell, on condition that in each channel region, the transistors are placeable in a plurality of strings in the horizontal direction of the cell and with horizontal placement state in which the gate width direction fits the horizontal direction of the cell.

2. The transistor placement method of claim 1, further comprising a group forming step of extracting, from the net list, transistors of the same conductivity type in which diffusion electrodes form serial connection having no branch, and collecting the extracted transistors into a group,
 wherein the one-dimensional placement step and the two-dimensional placement step place, as a single placement element, the transistors collected into the group at the group forming step.

3. The transistor placement method of claim 1, wherein the one-dimensional placement step and the two-dimensional placement step place the transistors by using an evaluation index based on an estimated value of a wiring length in the cell.

4. The transistor placement method of claim 3, wherein the one-dimensional placement step and the two-dimensional placement step include a step of dividing a wiring of each net into a plurality of components on the basis of positioning in the net, estimating wiring lengths for each component, and adding values obtained by weighting estimated values of the wiring lengths of each component to use the sum as the evaluation index of the transistor placement.

5. The transistor placement method of claim 4, wherein the one-dimensional placement step and the two-dimensional placement step include a step of dividing the wiring of the net into a component to be allocated to a polysilicon layer and a component to be allocated to a metal layer, and adding values obtained by differently weighting an estimated value of a wiring length of the component to be allocated to the polysilicon layer and an estimated value of the wiring length of the component to be allocated to the metal layer to use the sum as the evaluation index of the transistor placement.

6. The transistor placement method of claim 1, wherein the cell is a MOS logic cell, further comprising a stage setting step of setting, for each transistor, a stage representing the number of gates on a path from the transistor to a signal output terminal associated with the transistor, on the basis of the net list, the one-dimensional placement step determining order of placement of the transistors by using the stages of each transistor set at the stage setting step.

7. The transistor placement method of claim 1, further comprising a transistor folding step of obtaining a wiring density of a horizontal wiring component for each placement position of the transistor in the horizontal direction of the cell from the result of the transistor placement obtained at the one-dimensional placement step, dividing, by gate folding, the transistor placed on one of transistor placement positions when a layout height obtained by adding a transistor height and the wiring density of the horizontal wiring component in the transistor placement position exceeds a preset value of a cell height, and correcting the result of the transistor placement obtained at the one-dimensional placement step by using the divided transistor as a new placement element.

8. A transistor placement method for determining placement of transistors in a cell region on the basis of a net list which describes information on connection of the transistors in a cell having at least one transistor, comprising:

a group forming step of extracting, from the net list, transistors of the same conductivity type in which diffusion electrodes form serial connection having no branch, and collecting the extracted transistors into a group; and a transistor placement step of performing the transistor placement by using, as a single placement element, the transistors collected into the group at the group forming step.

9. A transistor placement method for determining placement of transistors in a cell region on the basis of a net list which describes information on connection of the transistors in a cell having at least one transistor, comprising:

a first step of dividing a wiring of each net into a plurality of components on the basis of positioning in the net, estimating wiring lengths for each component, and adding values obtained by weighting estimated values of the wiring lengths of each component; and a second step of determining the placement of the transistors by using the sum as an evaluation index.

10. The transistor placement method of claim 9, wherein the first step divides the wiring of the net into a component to be allocated to a polysilicon layer and a component to be allocated to a metal layer, and add values obtained by differently weighting an estimated value of a wiring length of the component to be allocated to the polysilicon layer and an estimated value of the wiring length of the component to be allocated to the metal layer, and the second step uses the sum as the evaluation index, thereby determining the placement of the transistors.

11. A transistor placement method for determining placement of each transistor in a cell region on the basis of a net list which describes information on connection of transistors in a MOS logic cell having at least one transistor, comprising:

a stage setting step of setting, for each transistor, a stage representing the number of gates on a path from the transistor to a signal output terminal associated with the transistor on the basis of the net list; and a placement step of placing the transistors of the cell in a string in the cell region on the basis of the net list, the placement step determining order of placement of the transistors by using the stages of each transistor set at the stage setting step.

12. A transistor placement method for determining placement of transistors in a cell region on the basis of a net list which describes information on connection of the transistors in a cell having at least one transistor and a mask design rule lead by a semiconductor manufacturing technique, comprising:

a first step of arranging a plurality of dots in a horizontal direction of the cell to set a dot string, setting a P-channel region to place P type transistors and an N-channel region to place N type transistors in parallel with the dot string, placing, on the basis of the net list, the P type transistors of the cell on the dot positions in the P-channel region, only one P type transistor being placed on one dot position, and the N type transistors of the cell on the dot positions in the N-channel region, only one N type transistor being placed on one dot position, thereby forming transistor placement on the dot string;

a second step of placing the transistors on a mask diagram so as to meet the mask design rule in order from one of sides to the other side in the horizontal direction of the cell in each channel region on the basis of the transistor placement on the dot string, thereby forming the transistor placement on the mask diagram; and a third step of evaluating the transistor placement on the mask diagram formed at the second step, and, on the basis of the result of evaluation, changing the transistor placement on the dot string which is a base of the evaluated transistor placement on the mask diagram; and the second and third steps being repeated, the second step, at the beginning of repetition, forming the transistor placement on the mask diagram from the transistor placement on the dot string formed at the first step and, on and after second repetition, forming the transistor placement on the mask diagram from the transistor placement on the dot string changed at the third step.

13. The transistor placement method of claim 12, wherein the second step determines a placement position of one of the transistors on the mask diagram, on the basis of a placement position on the mask diagram of a transistor provided on an adjacent dot position on the one side in the same channel region if any, and if not, on the basis of a placement position on the mask diagram of a transistor provided on the same dot position in a different channel region and having a placement position on the mask diagram determined.

14. The transistor placement method of claim 12, wherein the third step includes a step of dividing an extension of each net on the mask diagram into a plurality of parts on the basis of electrodes of transistors forming the net, estimating the extension in each part, and evaluating the transistor placement on the mask diagram by using, as an evaluation index, the sum of values obtained by weighting estimated values of each part.

15. The transistor placement method of claim 14, wherein the third step includes a step of dividing the extension of the net on the mask diagram into four parts, that is, an extension of a diffusion electrode of a P type transistor, an extension of a diffusion electrode of an N type transistor, an extension of a gate electrode and an extension of a full electrode, estimating the extension in each part, and evaluating the transistor placement on the mask diagram by using, as the evaluation index, the sum of values obtained by weighting estimated values of each part.

* * * * *